United States Patent
Ito et al.

(10) Patent No.: US 6,878,906 B2
(45) Date of Patent: Apr. 12, 2005

(54) CERAMIC HEATER FOR SEMICONDUCTOR MANUFACTURING AND INSPECTING EQUIPMENT

(75) Inventors: Yasutaka Ito, Gifu (JP); Atsushi Ito, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 40 days.

(21) Appl. No.: 10/111,980

(22) PCT Filed: Aug. 30, 2001

(86) PCT No.: PCT/JP01/07455

§ 371 (c)(1),
(2), (4) Date: Jun. 27, 2002

(87) PCT Pub. No.: WO02/19400

PCT Pub. Date: Mar. 7, 2002

(65) Prior Publication Data

US 2004/0026402 A1 Feb. 12, 2004

(30) Foreign Application Priority Data

Aug. 30, 2000 (JP) ............................. 2000-261474

(51) Int. Cl.⁷ ................................................ H05B 3/68
(52) U.S. Cl. ............................ 219/444.1; 219/448.11; 219/544
(58) Field of Search ........................ 219/443.1, 444.1, 219/448.11, 465.1, 466.1, 468.1, 468.2, 543, 544, 548; 118/724, 725

(56) References Cited

U.S. PATENT DOCUMENTS

| | | | | |
|---|---|---|---|---|
| 4,960,978 A | * | 10/1990 | Lorenz et al. | 219/448.17 |
| 5,643,483 A | * | 7/1997 | Kubota et al. | 219/543 |
| 6,150,636 A | * | 11/2000 | Bogdanski et al. | 219/461.1 |
| 6,257,758 B1 | * | 7/2001 | Culbertson | 374/120 |
| 6,465,763 B1 | | 10/2002 | Ito et al. | |
| 6,475,606 B2 | | 11/2002 | Niwa | |
| 6,507,006 B1 | | 1/2003 | Hiramatsu et al. | |
| 2003/0015521 A1 | | 1/2003 | Ito | |

FOREIGN PATENT DOCUMENTS

| | | |
|---|---|---|
| EP | 863544 | 9/1998 |
| EP | 10-233435 | 9/1998 |
| JP | 1-153596 | 6/1989 |
| JP | 4-98784 | 3/1992 |
| JP | 11-312570 | 11/1999 |
| JP | 2000-114354 | 4/2000 |

OTHER PUBLICATIONS

U.S. Appl. No. 10/876,665, filed Jun. 28, 2004, Ito, et al.
U.S. Appl. No. 10/901,109, filed Jul. 29, 2004, Hiramatsu, et al.
U.S. Appl. No. 10/900,113, filed Jul. 28, 2004, Hiramatsu, et al.
U.S. Appl. No. 10/345,356, filed Jan. 16, 2003, Ito.

(Continued)

Primary Examiner—Sang Paik
(74) Attorney, Agent, or Firm—Oblon, Spivak, McClelland, Maier & Neustadt, P.C.

(57) ABSTRACT

An object of the present invention is to provide a ceramic heater for a semiconductor producing/examining device which is capable of accurately measuring the temperature of an object to be heated and evenly heating the whole body of a silicon wafer by adjusting the heating state of a heating element based on the temperature measurement result, and the ceramic heater for a semiconductor producing/examining device of the present invention is a ceramic heater including a ceramic substrate and a heating element formed on the surface or the inside of the ceramic substrate, wherein a temperature measurement element is formed while being brought into contact with the ceramic substrate and the surface roughness of the ceramic substrate brought into contact with the temperature measurement element is $Ra \leq 5 \ \mu m$.

20 Claims, 11 Drawing Sheets

U.S. PATENT DOCUMENTS

U.S. Appl. No. 10/182,009, filed Jul. 24, 2002, Zhou.
U.S. Appl. No. 10/222,928, filed Aug. 19, 2002, Ito.
U.S. Appl. No. 10/265,413, filed Oct. 7, 2002, Ohashi et al.
U.S. Appl. No. 10/365,519, filed Feb. 3, 2003, Ito.
U.S. Appl. No. 10/217,029, filed Aug. 13, 2002, Ito.
U.S. Appl. No. 10/030,123, filed May 16, 2002, Hitamatsu et al.
U.S. Appl. No. 10/069,943, filed Jul. 10, 2002, Ito et al.
U.S. Appl. No. 10/069,511, filed Jun. 24, 2002, Ito et al.
U.S. Appl. No. 10/069,510, filed Jun. 20, 2002, Hiramatsu et al.
U.S. Appl. No. 10/070,443, filed Jun. 24, 2002, Hiramatsu et al.
U.S. Appl. No. 10/070,441, filed Jun. 26, 2002, Ito et al.
U.S. Appl. No. 10/088,098, filed May 30, 2002, Ito et al.
U.S. Appl. No. 10/088,100, filed Jun. 26, 2002, Ido.
U.S. Appl. No. 10/111,980, filed Jun. 27, 2002, Ito et al.
U.S. Appl. No. 10/226,160, filed Aug. 23, 2002, Ito et al.
U.S. Appl. No. 10/229,177, filed Aug. 28, 2002, Hiramatsu et al.
U.S. Appl. No. 10/311,368, filed May 9, 2003, Ito et al.
U.S. Appl. No. 10/352,138, filed Jan. 28, 2003, Hiramatsu et al.
U.S. Appl. No. 10/346,095, filed Jan. 17, 2003, Ito et al.
U.S. Appl. No. 10/343,747, filed Aug. 27, 2003, Ito et al.
U.S. Appl. No. 10/344,148, filed Jul. 29, 2003, Kariya et al.
U.S. Appl. No. 10/343,833, filed Sep. 22, 2003, Zhou et al.
U.S. Appl. No. 10/386,615, filed Mar. 13, 2003, Hiramatsu et al.
U.S. Appl. No. 10/387,452, filed Mar. 14, 2003, Ito et al.
U.S. Appl. No. 10/363,310, filed Mar. 3, 2003, Ito.
U.S. Appl. No. 10/397,321, filed Mar. 27, 2003, Hiramatsu et al.
U.S. Appl. No. 10/398,393, filed Jan. 21, 2004, Hiramatsu et al.
U.S. Appl. No. 10/442,967, filed May 22, 2003, Hiramatsu et al.
U.S. Appl. No. 10/260,360, filed Oct. 1, 2002, Niwa.
U.S. Appl. No. 10/615,950, filed Jul. 10, 2003, Hiramatsu et al.
U.S. Appl. No. 10/416,497, filed Dec. 11, 2003, Hiramatsu et al.
U.S. Appl. No. 10/618,651, filed Jul. 15, 2003, Ito et al.
U.S. Appl. No. 10/618,623, filed Jul. 15, 2003, Ito et al.
U.S. Appl. No. 10/618,655, filed Jul. 15, 2003, Ito et al.
U.S. Appl. No. 10/618,665, filed Jul. 15, 2003, Ito et al.
U.S. Appl. No. 10/380,327, filed May 8, 2003, Hiramatsu et al.
U.S. Appl. No. 10/619,567, filed Jul. 16, 2003, Hiramatsu et al.
U.S. Appl. No. 10/362,941, filed Apr. 28, 2003, Ito.
U.S. Appl. No. 10/244,008, filed Sep. 16, 2002, Niwa.
U.S. Appl. No. 10/670,354, filed Sep. 26, 2003, Niwa.
U.S. Appl. No. 10/658,454, filed Sep. 10, 2003, Ito et al.
U.S. Appl. No. 10/663,681, filed Sep. 17. 2003, Ito et al.
U.S. Appl. No. 10/473,585, filed Feb. 13, 2004, Ito et al.
U.S. Appl. No. 10/697,287, filed Oct. 31, 2003, Ito et al.
U.S. Appl. No. 10/718,535, filed Nov. 24, 2003, Hiramatsu et al.
U.S. Appl. No. 10/840,244, filed May 7, 2004, Ido.
U.S. Appl. No. 10/840,254, filed May 7, 2004, Ido.

* cited by examiner

CERAMIC HEATER FOR SEMICONDUCTOR MANUFACTURING AND INSPECTING EQUIPMENT

TECHNICAL FIELD

The present invention relates to a ceramic heater for a semiconductor producing/examining device, which can be for heating a variety of objects, and more particularly to a ceramic heater for a semiconductor producing/examining device, which can be preferably used for drying, sputtering and the like of a silicon wafer and the like in the semiconductor industry, and which has an excellent temperature evenness of a heating face thereof.

BACKGROUND ART

A semiconductor product is produced through several steps including a step of forming a photosensitive resin as an etching resist on a silicon wafer to perform etching for the silicon wafer. This photosensitive resin is liquid-state, so that it is applied onto a surface of the silicon wafer by using a spin coater and the like. However, the photosensitive resin must be dried after applying, and thus the silicon wafer applied with the resin is placed on a heater and heated for drying. Conventionally, a heater used for such a purpose is made of a metal, for example, a heater in which a heating element is arranged on a back face of an aluminum plate has been employed as the heater made of metal.

However, such a heater made of metal has the following problems. First, the thickness of the substrate must be as thick as about 15 mm since the substrate is made of metal. This is because, in a thin metal plate, a bend or a strain is generated because of thermal expansion resulting from heating so that a semiconductor wafer put on the metal plate is damaged or inclined. However, if the thickness of the substrate is made thick, the heater becomes heavy and bulky.

At the time of heating, the heating temperature is controlled by changing the voltage or amperage applied to the heating elements. However, since the metal plate is thick, the temperature of the substrate does not follow the change in the voltage or amperage promptly. Thus, the temperature thereof cannot be easily controlled. Thus, as disclosed in JP Kokoku Hei No. 8-8247, there are suggested techniques of performing the temperature-control of a nitride ceramic with which a resistance heating element is formed, by measuring the temperature in the vicinity of the resistance heating element.

Inventors of the present invention also tried to heat a silicon wafer employing the technique, however at that time, a problem of occurrence of temperature distribution on the surface of the heater took place. Therefore, inventors of the present invention have made enthusiastic investigations of causes of the temperature distribution and consequently, found that a reason for the occurrence of the temperature distribution in spite of temperature control is the fact that: a surface roughness of the ceramic substrate contacting a thermocouple is high and thus the contact of the thermocouple and a temperature measurement element becomes a point contact, so that the heat of the ceramic substrate cannot sufficiently be transmitted to the thermocouple to result in erroneous measurement result by the thermocouple.

Further, also a problem such that the thermocouple attached to the ceramic substrate became easy to be dropped during a long time use took place. The thermocouple is normally fixed on the surface of the ceramic substrate using a solder or an inorganic adhesive material or fixed in the inside of a bottomed hole formed on the bottom face of the ceramic substrate, and if the thermocouple is dropped, a heater becomes uncontrollable, resulting in occurrence of fires and serious incidents.

SUMMARY OF THE INVENTION

Thus, inventors of the present invention have carried out further investigations to solve such problems and, with respect to a solution for the problem of the occurrence of the temperature distribution of the heater surface, found out that the above-mentioned problem can be solved by making the surface of the ceramic substrate smooth to have the surface roughness Ra of 5 $\mu$m or less, particularly preferably 2 $\mu$m or less, by polishing the face of the ceramic substrate contacting the thermocouple or further forming an insulating layer on the surface of the above-mentioned ceramic substrate.

Further, with respect to the problem that the temperature measurement element of the thermocouple drops during a long time use, the cause is found out that it is owing to the deterioration of a fixing member such as the solder, the inorganic adhesive, and the like by heating. Therefore, at the time of installation of the temperature measurement element in the ceramic substrate, if the temperature measurement element is pushed against and fixed on the ceramic substrate by physical force not by a conventional adhesion or fixation, the problem owing to the thermal deterioration is supposed to be solved and thus the present invention is completed.

The present invention is completed based on the above-mentioned findings, and an object thereof is to provide: a ceramic heater for a semiconductor producing/examining device, excellent in the response to a thermocouple and scarcely causing the temperature distribution; and a ceramic heater for a semiconductor producing/examining device, excellent in durability and capable of heating an object to be heated such as a semiconductor wafer with even temperature.

That is, a ceramic heater for a semiconductor producing/examining device of a first aspect of the present invention is a ceramic heater comprising: a ceramic substrate; and a heating element formed on the surface of the ceramic substrate or inside of the ceramic substrate, wherein a temperature measurement element is formed while being brought into contact with the above-mentioned ceramic substrate and the surface roughness Ra of the ceramic substrate brought into contact with the above-mentioned temperature measurement element is Ra≦5 $\mu$m, desirably Ra≦2 $\mu$m.

In the first aspect of the ceramic heater for the semiconductor producing/examining device of the present invention, if the temperature measurement element such as a thermocouple is brought into contact with the ceramic substrate having a surface roughness Ra ≦2$\mu$m, the above-mentioned temperature measurement element and the above-mentioned ceramic substrate are brought into almost face contact with each other, so that heat is sufficiently transmitted to the temperature measurement element from the ceramic substrate to make the accurate temperature measurement of the ceramic substrate possible. Incidentally, in the first aspect of the present invention, in the case an insulating layer is formed on the surface of the ceramic substrate, the surface roughness of the ceramic substrate means the surface roughness of the insulating layer surface.

If Ra>2 $\mu$m, the contact with the temperature measurement element becomes a point contact, so that the heat is not sometimes transmitted sufficiently to make the accurate temperature measurement impossible.

However, in the case Ra is from 2 to 5 μm, the contact surface area can be assured to some extent by transversely laying the temperature measurement element to increase the contact area, so that the temperature measurement error can be corrected. However, if Ra exceeds 5 μm, it is found out difficult to accurately control the temperature by any means.

To keep the surface roughness Ra≦5 μm, preferably Ra≦2 μm, a method for polishing the surface of the ceramic substrate or forming an insulating layer with a higher volume resistivity than that of the ceramic substrate on the surface of the ceramic substrate are desirable.

The surface roughness Ra of the ceramic substrate is preferably to be higher than 0.001 μm. If the substrate is too smooth, the temperature measurement element slips and becomes difficult to be brought into contact with the surface of the ceramic substrate.

The surface roughness Ra is, particularly, optimum in a range from 0.05 to 1 μm.

The method for adjusting the surface roughness of the ceramic substrate surface is carried out by, for example, simultaneously polishing both faces using a diamond grind stone with a roughness of #100 to #1,000 while applying a load of 0.1 to 50 kg/cm$^2$ from both faces. The rotation speed of the grind stone is preferably 50 to 300 rpm. Further, for the surface finishing, polishing is preferably carried out using a diamond paste (particle size of 0.1 to 5 μm) and a cloth in combination.

A concaved portion may be formed in the ceramic substrate and the temperature measurement element may be put in the concaved portion. In the case the inside of the concaved portion is ground and polished, a rod-like grind stone and a polishing material may be used.

Further, in the above-mentioned ceramic heater for a semiconductor producing/examining device of the first aspect of the present invention, the above-mentioned ceramic substrate and the above-mentioned temperature measurement element are desirably brought into contact with each other through a heat transmission plate having a higher thermal conductivity than that of the above-mentioned ceramic substrate. Because the contact surface area with the temperature measurement element can be widened by the existence of the heat transmission plate and the temperature of the ceramic substrate can be measured more accurately.

Further, the above-mentioned temperature measurement element is desirable to be fixed while being brought into contact with the ceramic substrate and further desirable to be pressed on the above-mentioned ceramic substrate. Because it can reliably brought into contact with the surface of the ceramic substrate and the heat transmission from the ceramic substrate can be better performed. As the method for pressing the temperature measurement element on the ceramic substrate, a method using a spring and the like is preferable.

Next, a second aspect of the present invention will be described.

A ceramic heater for a semiconductor producing/ examining device of a second aspect of the present invention is a ceramic heater comprising: a ceramic substrate; and a resistance heating element formed on the surface of the ceramic substrate or inside of the ceramic substrate, wherein the resistance heating element is pressed on the above-mentioned ceramic substrate.

The ceramic heater for the semiconductor producing/ examining device according to the second aspect of the present invention, the temperature measurement element is pressed on the ceramic substrate using a mechanical means but not brought into contact with the ceramic substrate without using a solder, an inorganic adhesive material and the like, and therefore any problem attributed to thermal deterioration of a solder or an inorganic adhesive material used for the contact and consequent dropping of the temperature measurement element does not take place.

Further, even if the ceramic substrate is expanded by heating or contracted by cooling, since the temperature measurement element is pushed only by physical force, the size change can be absorbed to suppress generation of the thermal stress and the like, thus preventing dropping of the temperature measurement element. Consequently, any problem that the heater becomes uncontrollable and fires take place is not caused and thus the ceramic heater for the semiconductor producing/examining device is provided with a high safe property.

The above-mentioned ceramic substrate and the temperature measurement element are preferably brought into contact with each other through a heat transmission plate having a higher thermal conductivity than that of the above-mentioned ceramic substrate. That is in order to increase the response and the measurement accuracy. Especially, a dent is formed in the heat transmission plate and the thermocouple is fitted in the dent to be fixed, so that the response and the measurement accuracy can be improved and the thermocouple can firmly be fixed as well.

The above-mentioned temperature measurement element can generally be pushed against the ceramic substrate, using elastic force of an elastic body. Practically, an elastic body such as a coil spring, a leaf spring and the like are used. Examples of the ceramic heater for the semiconductor producing/examining device using a coil spring is illustrated in FIGS. 4 to 9 and examples of the ceramic heater for the semiconductor producing/examining device using a leaf spring is illustrated in FIGS. 10 to 12.

As described above, the temperature measurement element is installed in the ceramic substrate while being brought into contact with the ceramic substrate and the surface roughness Ra of the ceramic substrate being brought into contact with the temperature measurement element is preferably Ra≦5 μm, more desirably Ra≦2 μm.

If the temperature measurement element such as a thermocouple is brought into contact with the ceramic substrate having a surface roughness Ra≦2 μm, the above-mentioned temperature measurement element and the above-mentioned ceramic substrate are brought into almost face contact with each other, so that heat is sufficiently transmitted to the temperature measurement element from the ceramic substrate to make the accurate temperature measurement of the ceramic substrate possible. If Ra>2 μm, the contact with the temperature measurement element becomes a point contact, so that the heat sometimes does not sufficiently transmit to make the accurate temperature measurement impossible. However, in the case Ra is from 2 to 5 μm, the contact surface area can be assured to some extent by transversely laying the temperature measurement element to increase the contact area, so that the temperature measurement error can be corrected.

To keep the surface roughness Ra at 2 μm or less, it is preferable to keep the surface roughness Ra at 2 μm or less by polishing the surface of the ceramic substrate or forming an insulating layer on the surface of the ceramic substrate.

Figure 1:
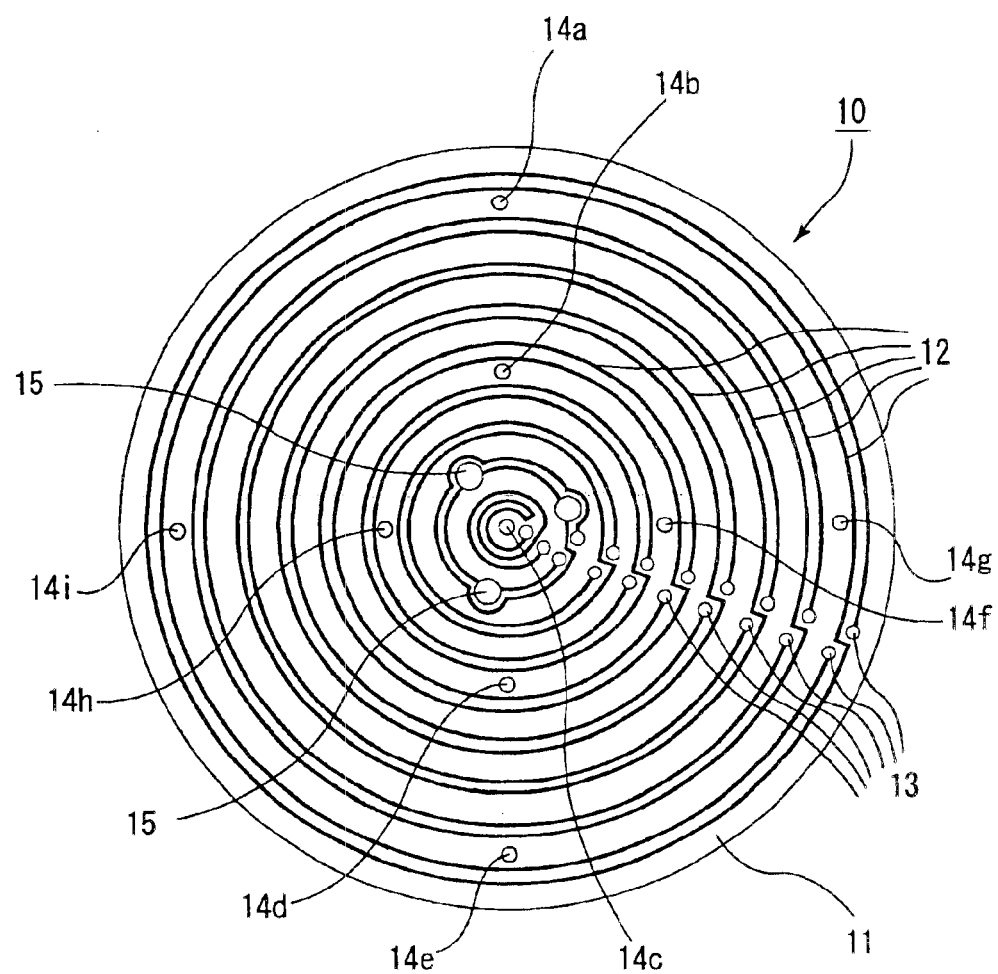
FIG. 1 is a bottom plane view schematically showing one example of a ceramic heater of the present invention.

EXPLANATION OF SYMBOLS 10, 20 ceramic heater
11, 21 ceramic substrate
11a, 21a heating face,
11b, 21b bottom face
12, 22 heating element
13 terminal pin
14 temperature measurement part
15, 25 through hole
16 lifter pin
19 silicon wafer
24 metal covering layer
27, 44, 64, 74 temperature measurement element (thermocouple)
28 conductor-filled through hole
23, 29 control unit
21, 30 memory unit
22, 31 computation unit
32 socket
45 spring
60, 75 leaf spring
65, 75 bolt
66 presser plate
S sheath

DETAILED DESCRIPTION OF THE INVENTION

A ceramic heater for a semiconductor producing/examining device of a first aspect of the present invention is a ceramic heater comprising a ceramic substrate and a heating element formed on the surface of the ceramic substrate or inside of the ceramic substrate, wherein a temperature measurement element is formed while being brought into contact with the ceramic substrate and the surface roughness Ra of the ceramic substrate is Ra≦5 μm, desirably Ra≦2 μm.

Hereinafter, the ceramic heater for the semiconductor producing/examining device of the first aspect of the present invention will be described along with its embodiment.

In the following description, the ceramic heater for the semiconductor producing/examining device is sometimes referred simply as to a ceramic heater.

As the insulating layer to be employed for the first aspect of the present invention, an oxide ceramic is preferable and practically, for example, silica, alumina, mullite, cordierite, beryllia and the like can be used.

The oxide ceramic has a volume resistivity higher than a nitride ceramic or a carbide ceramic and therefore is particularly advantageous for the insulating layer.

Such an insulating layer may be formed: by applying a sol solution produced by hydrolysis polymerization of an alkoxide to a ceramic substrate by spin coating and drying and firing the sol; or by sputtering, CVD, and the like. Also, the surface of the ceramic substrate may be subjected to oxidation treatment to form an oxide layer and the oxide layer may be used as the insulating layer. In addition, as an insulating layer 500, an alumina plate, a quarts plate, and the like may be used.

In the first aspect of the present invention, in order to adjust the surface roughness Ra of the ceramic substrate being brought into contact with a temperature measurement element to be Ra≦5 μm, desirably Ra≦2 μm, the surface of the ceramic substrate is ground to be smoothed, or an insulating layer having the surface roughness Ra≦5 μm, preferably Ra≦2 μm is formed.

The thickness of the above-mentioned insulating layer is preferably 0.1 to 3000 μm. If it is less than 0.1 μm, the layer does not function as an insulating layer and if it exceeds 3000 μm, the response of a temperature measurement element is deteriorated in the case the temperature measurement element is installed.

Figure 4:
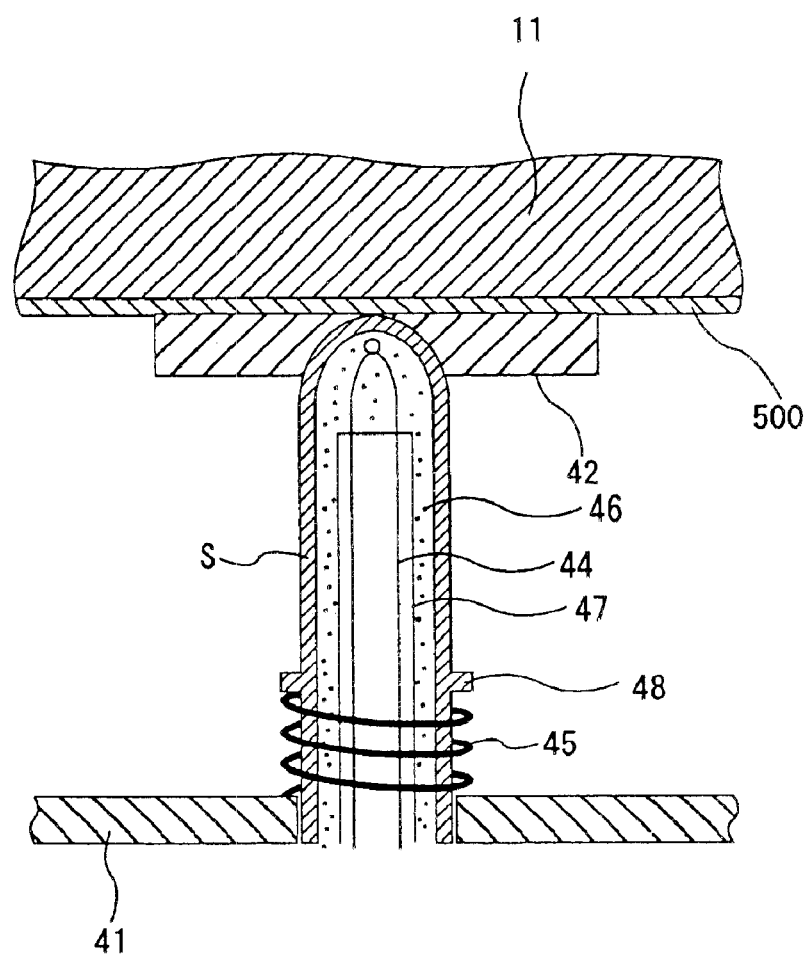
FIG. 4 is a sectional view schematically showing one example of a contact structure of a temperature measurement element of the ceramic heater of the present invention.
Figure 5:
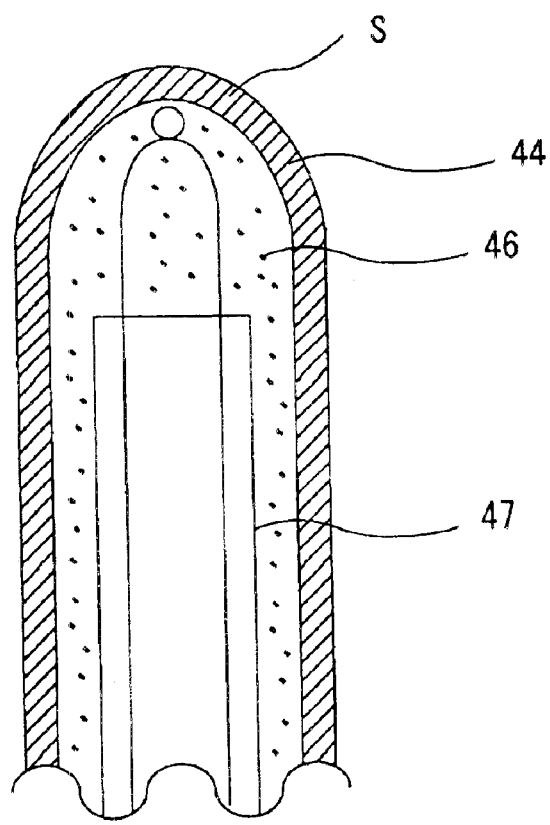
FIG. 5 is a sectional view showing a structure of a sheath-type thermocouple.

The insulating layer may be formed on the whole surface of the ceramic substrate. In this case, a heating element can be formed on the insulating layer. Also, the insulating layer may be formed only in the portion where the temperature measurement element is brought into contact. For example, as shown in FIG. 5, a thermocouple 44 is housed in a sheath S made of a stainless steel and an insulating powder 46 such as alumina, silica, magnesia and the like is filled therein and the resulting sheath S as a whole may be pushed against the surface of the ceramic substrate 11 coated with the insulating layer 50 by a spring 45 as shown in FIG. 4. In this case, a projected part 48 is formed on the side face of the sheath S and a spring 45 is installed between the projected part 48 and a plate-like body 41, which is the bottom plate or the intermediate bottom plate. The spring may be a coil spring as shown in FIG. 4 or a leaf spring.

Further, at that time, the sheath S containing a temperature measurement element such as the thermocouple 44 and the like therein may be fitted and fixed in an alumina pipe P so as to be brought into contact with the ceramic substrate 11 and as shown in FIG. 4, a heat transmission plate 42 made of a metal plate and the like may be interposed between the sheath S containing the thermocouple 44 and the insulating layer 500 to increase the thermal conductivity between them. As the metal plate, aluminum, a stainless steel, nickel, copper, a noble metal and the like may be used.

Further, as shown in FIG. 4, in order to make the contact surface area of the heat transmission plate 42 and the sheath S large, a dent (concave portion) having the similar shape to that of the tip end of the sheath S is preferable to be formed in the heat transmission plate 42.

For the sheath S, other than metals, a ceramic such as alumina may be used. However, to avoid deterioration of the response of the temperature measurement element by the existence of the sheath S, the thickness and the material thereof are required to be controlled and selected.

The ceramic heater of the first aspect of the present invention is made possible to accurately measure the temperature of an object to be heated by employing the above-mentioned means and by carrying out control based on the temperature measurement results, the heat generating state of the heating element can properly be controlled and accordingly, a whole body of a variety of objects to be heated such as a silicon wafer and the like can and evenly be heated. That is, in the ceramic heater of the first aspect of the present invention, the temperature measurement element and the ceramic substrate are brought into face-contact with each other and therefore, the accurate temperature measurement of the ceramic substrate is made possible; and by controlling the heat generating state of the heating element based on the temperature measurement result, an object to be heated can evenly be heated.

The above-mentioned ceramic substrate and the temperature measurement element may be brought into contact with each other through a heat transmission plate made of: the above-mentioned metal plate; nitride ceramic; or carbide ceramic and the like. Such a heat transmission plate made of a metal plate and the like has a high thermal conductivity and thus is capable of improving the response of the thermocouple. Also, as mentioned above, a dent may be formed in the heat transmission plate 42 to enlarge the contact surface area with the thermocouple and accordingly, the response can further be improved.

Figure 2:
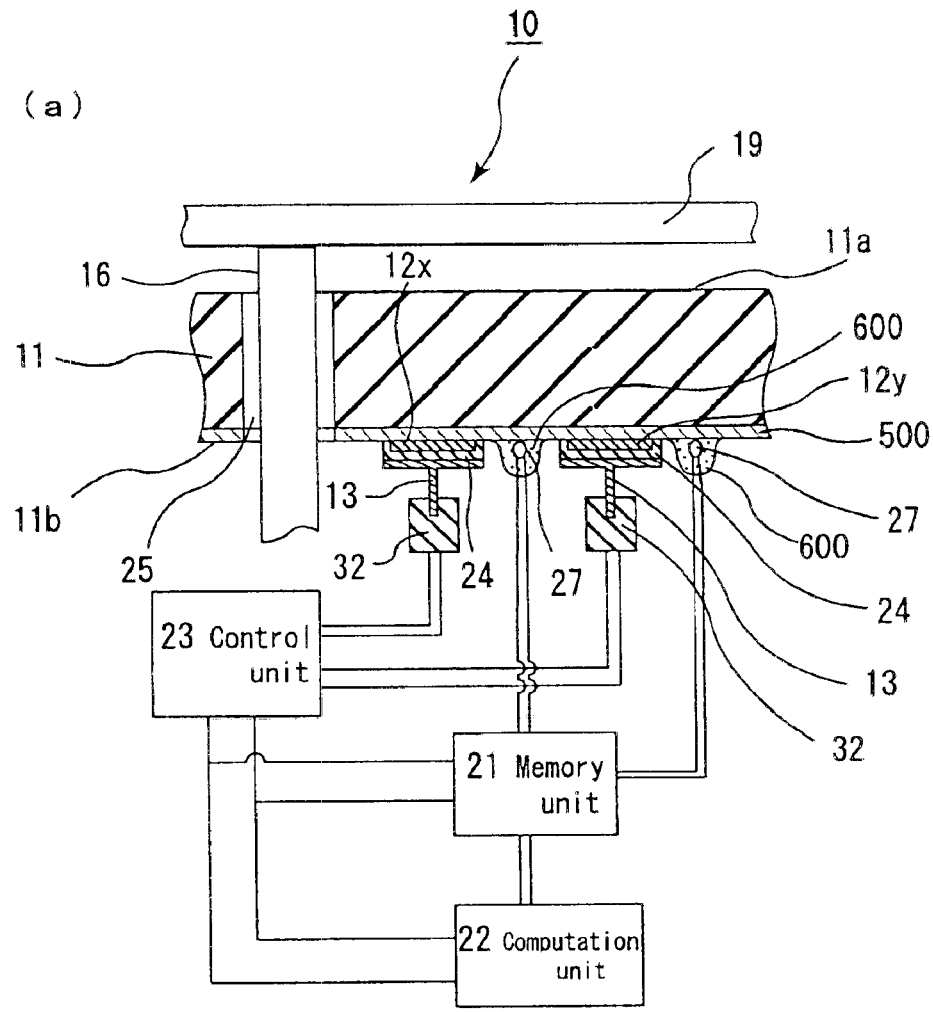
FIG. 2(a) is a block diagram schematically showing a ceramic heater of a first aspect of the present invention in which a heating element is formed on a bottom face of a ceramic substrate.
FIG. 2(b) is a partially enlarged sectional view showing a part at which a thermocouple of the above-mentioned ceramic heater is installed.
Figure 2:
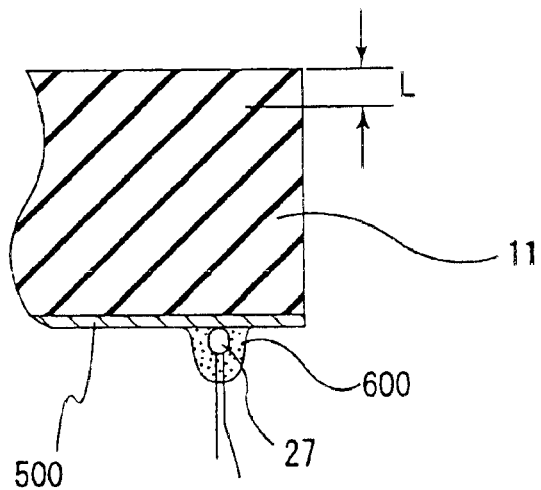

The above-mentioned temperature measurement element is preferable to be fixed in the above-mentioned ceramic substrate while being brought into contact with the ceramic substrate. Practically, as shown in FIG. 2(*b*), it is preferable to be attached to and fixed on the substrate by a protection member 600 made of heat resistant resin or a ceramic.

Figure 7:
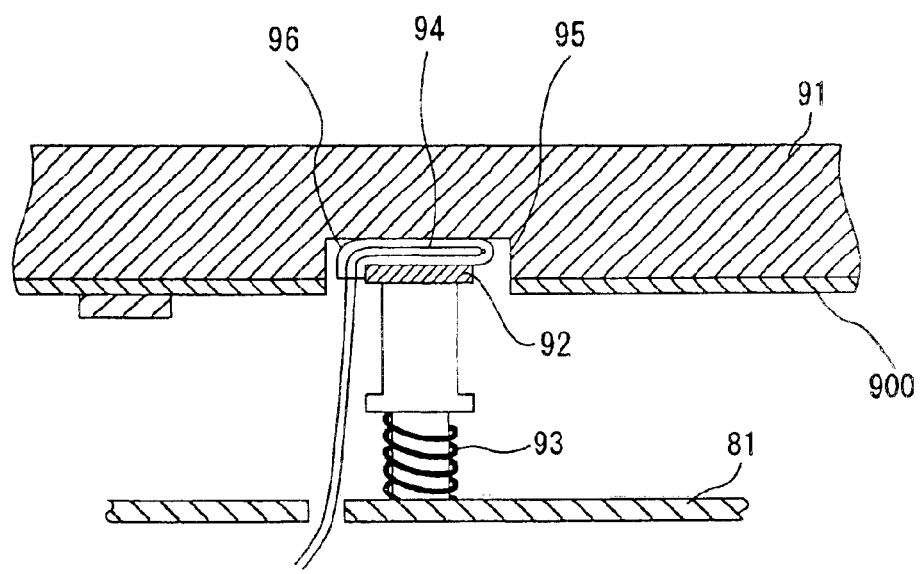
FIG. 7 is a sectional view schematically showing an example of a contact structure of a temperature measurement element in the ceramic heater of the present invention.

Also, as shown in FIG. 4, using an elastic body such as a spring 45, the temperature measurement element may be brought into contact with the ceramic substrate by being pushed against the surface of the ceramic substrate or, as shown in FIG. 7, being pushed against the bottom face of a concave portion formed in face of the ceramic substrate at the opposed side to the heating face by an elastic body.

FIG. 7 is a sectional view schematically showing a contact structure of the above-mentioned thermocouple.

A concave portion 95 is formed on a opposed side face to the heating face of the ceramic substrate 91, and the thermocouple 94 housed in the sheath 96 is pushed against the bottom face of this concave portion 95 by the spring 93, which is an elastic body fixed to the plate-like body 81, through the aluminum plate 92, so that the ceramic substrate 91 and the thermocouple 94 are brought into contact with each other.

The contact structure as shown in FIG. 4 and FIG. 7 can absorb the size change owing to the thermal expansion and contraction and therefore is advantageous.

The temperature measurement element may be brought into contact with the ceramic substrate surface as it is and also may be covered with a sheath and brought into contact transversely (FIG. 7).

Further, as shown in FIG. 7, it may be pushed by a member of such as a metal and the like having a high thermal conductivity.

The ceramic substrate holding a heating element and made of a nitride ceramic or a carbide ceramic has a thermal expansion coefficient smaller than that of metal and mechanical strength remarkably higher than that of metal. Accordingly, even if the ceramic substrate is made thin in the thickness, it is not warped or distorted by heating. As a result, the ceramic substrate can be made thin and light by weight. Further, since the thermal conductivity of the ceramic substrate is high and the ceramic substrate itself is thin, the surface temperature of the ceramic substrate can quickly follow the temperature change of the heating element. That is, by changing the temperature of the heating element by changing the voltage and the electric current value, the surface temperature of the ceramic substrate can properly be controlled.

The ceramic heater of the first aspect of the present invention, as mentioned above, is a ceramic heater in which a heating element is formed on the surface or inside of a ceramic substrate. Firstly, the ceramic heater will be schematically described by using FIGS. 1 and 2.

FIG. 1 is a bottom plane view schematically showing one example of a ceramic heater of the first aspect of the present invention.

FIG. 2(*a*) is a block diagram schematically showing a ceramic heater of a first aspect of the present invention in which a heating element is formed on a bottom face of a ceramic substrate, and FIG. 2(*b*) is a partially enlarged sectional view showing a vicinity of a part at which a thermocouple of the above-mentioned ceramic heater is installed. Noted that FIG. 2(*a*) shows a part of a cross-section of the ceramic substrate shown in FIG. 1.

As shown in FIG. 1, the ceramic substrate 11 is formed to be a disk-like shape and the heating element 12 is formed into a concentric pattern at the bottom face 11*b* of the ceramic substrate 11 since heating has to be carried out so as to keep the temperature even on the whole heating face (the face opposite to the illustrated bottom face) 11*a* of the ceramic substrate 11.

The heating element 12 is composed by connecting a pair of mutually neighboring two concentric heaters to be one line and connecting terminal pins 13 to be input and output terminals in both ends. Further, at the portion near the center, through holes 15 to insert lifter pins 16 into for holding various kinds of objects to be heated, such as a silicon wafer and the like, are formed and further thermocouples 27 are fixed in the temperature measurement parts 14*a* to 14*i* using protection members 600.

The thickness of the ceramic substrate in the ceramic heater of the first aspect of the present invention is preferably 50 mm or less, more desirably 25 mm or less.

If the thickness of the ceramic substrate exceeds 25 mm, the heat capacity of the ceramic substrate increases and especially, in case that heating and cooling is carried out by installing a temperature control means, the temperature following property is deteriorated owing to the high heat capacity in some cases.

The optimum thickness of the ceramic substrate is 5 mm or less. Incidentally, the thickness is preferable to be not thinner than 1.5 mm.

If it is thinner than 1.5 mm, the strength is decreased and the substrate becomes easy to be broken, whereas if it thicker than 5 mm, it becomes difficult to transmit heat to result in decrease of heating efficiency.

With respect to the material of the ceramic substrate 11, a variety of ceramics with high thermal conductivity can be used, yet a nitride ceramic or a carbide ceramic is desirable.

Examples of the above-mentioned nitride ceramic include aluminum nitride, silicon nitride, boron nitride, titanium nitride and the like. They may be used alone or in combination of two or more of them. Examples of the carbide ceramic include silicon carbide, zirconium carbide, titanium carbide, tantalum carbide, tungsten carbide and the like. They may be used alone or in combination of two or more of them. Among them, aluminum nitride is most preferable. The reason for that is because it has the highest thermal conductivity as high as 180 W/m·K and is excellent in the temperature following property and accordingly, although it tends to cause unevenness of the temperature distribution, such a problem can be avoided by employing the arrangement and formation structure of the first aspect of the present invention for the temperature measurement element 27.

Also, as shown in FIG. 2, an insulating layer 500 is formed on the bottom face 11$b$ of the ceramic substrate 11 and a temperature measurement element such as a thermocouple 27 and the like is brought into contact with the insulating layer 500 to measure the temperature of the ceramic substrate 11. In the case of bringing the temperature measurement element such as the thermocouple 27 into contact with the ceramic substrate, as shown in FIGS. 2, 3 it may be fixed using a protection member 600 made of a heat resistant resin or ceramic, and a temperature measurement element such as a thermocouple 44 installed in a sheath S also may be brought into contact with the bottom face 11$b$ of the ceramic substrate 11 through sheath S by using a spring 45 as shown in FIG. 4.

Examples of such a temperature measurement element include a thermocouple, a platinum temperature measurement resistor, a thermistor and the like. Further, the above-mentioned thermocouple includes, for example, as listed up in JIS-C-1602 (1980), K-type, R-type, S-type, E-type, J-type, T-type thermocouples and the like. Among them, the K-type thermocouple is preferable. The size of the joining part of the thermocouple and the ceramic plate is preferably larger than the diameter of a strand and 0.5 mm or less. That is because in the case the joining part is large, the heat capacity is increased and the response is deteriorated. Incidentally, it is difficult to make the size smaller than the diameter of the strand.

Such temperature measurement elements as described above are to be fixed in the temperature measurement portions 14$a$ to 14$i$ and sealed with a heat resistant resin or a protection member 600, and at that time, both ways may be used. As the above-mentioned heat resistant resin, for example, thermosetting resin, especially, epoxy resin, polyimide resin, bismaleimide-triazine resin, and the like can be exemplified. These resin materials may be used alone or in combination with two or more of them. Further, as the ceramic, alumina sol and silica sol and the like may be used and these ceramic sol materials are dried to be gel so as to fix the temperature measurement element. Other than such a manner of fixing the thermocouple, as described in the description of FIG. 4, the method may be a manner of contacting the temperature measurement element directly.

Figure 3:
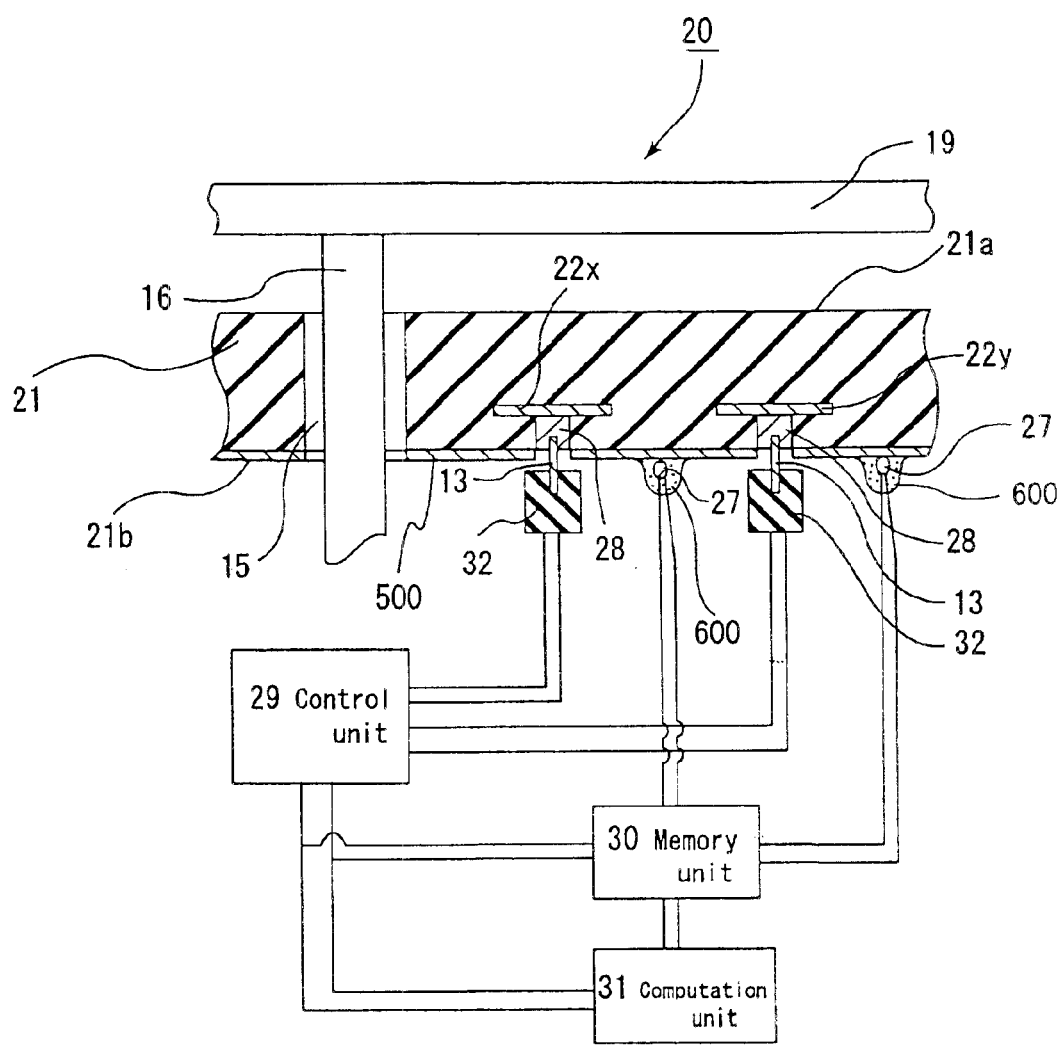
FIG. 3 is a block diagram schematically showing a ceramic heater of a first aspect of the present invention in which a heating element is provided inside of the ceramic substrate.

The heating element in the above-mentioned ceramic heater, as shown in FIGS. 1 and 2, may be formed on the bottom face 11$b$ of the ceramic substrate 11 and, as shown in FIG. 3, also may be formed inside of the ceramic substrate 21. In the former case, as shown in FIG. 2, the opposed face is desirable to be the heating face 11$a$ where an object to be heated such as a silicon wafer and the like is heated and in the latter case of the heating element being formed inside, as shown in FIG. 3, the heating element is preferable to be installed eccentrically from the center in the thickness direction of the ceramic substrate and the face remote from the heating element is desirable to be the heating face 21$a$. In the first aspect of the present invention, by setting the setting position of the heating element in such a manner, during transmission of the heat generated from the heating element, the heat is diffused to the whole ceramic substrate and the temperature distribution in the face where an object to be heated (for example a silicon wafer) to be heated is made even and as a result, the temperature in each portion of the object to be heated can be made even.

Further, referring to the setting position of the ceramic material, as shown in FIG. 3, in the case the heating element 22 (22$x$, 22$y$) of the first aspect of the present invention is installed inside thereof and eccentrically out of the center, the position is preferable to be near to the face (bottom face) on the opposite to the heating face 21$a$ of the ceramic substance 21 and at a point exceeding 50% and up to 99% to the distance from the heating face 21$a$ to the bottom face 21$b$. That is because if it is less than 50%, the position is too near to the heating face to cause uneven temperature distribution and on the contrary, if it exceeds 99%, the ceramic substrate 11 itself warps to result in distortion of an object to be heated such as a silicon wafer.

Further, in the case the heating element 22 is formed inside of the ceramic substrate 21, the layer forming the heating element may be formed in a plurality of separate layers but not to be a single layer. In such a case, the patterns of the respective layers are preferably formed in a manner that heating element 22 is formed in any layer as to supplement the patterns one another when observed from the direction at rectangular angles to the heating face so that the patterns of the heating element 11 seem to exist in the whole region when observed from the upper side of the heating face. As such a structure, for example, a staggered arrangement can be exemplified.

Regarding the arrangement pattern (shape) of the above-mentioned heating element, other than the concentric circle as shown in FIG. 1, for example, a spiral, an eccentric circle, a curved line and the like can be exemplified, yet the concentric arrangement is preferable. Further, in the case of the concentric pattern, as shown in FIG. 1, the heating element is preferable to be divided into 2 or more circuits, and further preferable to be divided into 2 to 10 circuits. That is because the heat radiation quantity can be changed by controlling the electric power to be applied to the respective circuits and thus the temperature of the heated face of a silicon wafer and the like can be adjusted by dividing the circuits.

The cross-sectional shape of the heating element is not particularly limited and may be rectangular or elliptical, however it is preferable to be flat as shown in FIG. 2 and FIG. 3. That is because the flat shape is convenient for radiating heat toward the heating face and scarcely causes temperature distribution on the heating face. The aspect ratio (width of the heating element/thickness of the heating element) of the cross-section in that case is preferably 10 to 5000. Adjustment within in the range makes the resistance value of the heating element high and also assures the evenness of the temperature on the heating face.

The reason for that is because in the case the thickness of the heating element is made to be constant, if the aspect ratio is too small than the above-mentioned range, the heat transmission quantity in the direction to the wafer heating face is small and the heat distribution approximately similar to the heating element pattern is caused on the heating face, whereas if the aspect ratio is too high, the temperature immediately above the center of the heating element becomes high and consequently, the heat distribution approximately similar to the heating element pattern is caused on the heating face. Accordingly, taking the temperature distribution into consideration, the aspect ratio of the cross-section is preferably 10 to 5000.

In the case the heating element is formed on the surface of the ceramic substrate, the aspect ratio of the cross-section is preferably 10 to 2000 and in the case the heating element is formed inside of the ceramic substrate, aspect ratio of the cross-section is preferably 200 to 5000. As it is so, the heating element has a higher aspect ratio in the case of formation inside of the ceramic substrate and it is attributed to that because installation of the heating element inside makes the distance between the heating face and the heating element short and the evenness of the surface temperature is deteriorated, the heating element itself is needed to be flat.

The practical thickness of the heating element, as shown in FIG. 1, is desirably 1 to 30 $\mu$m, more preferably 1 to 10 $\mu$m, in the case the heating element 12 is formed on the surface of the ceramic substrate 11. As shown in FIG. 3, it is preferably 1 to 50 $\mu$m in the case the heating element 12 is formed inside of the ceramic substrate 11. Further, the width of the heating element is preferably 0.1 to 20 mm, more preferably 0.1 to 5 mm in the case the heating element 12 is formed on the surface of the ceramic substrate 11. The thickness is preferably 5 to 20 $\mu$m in the case the heating element 22 is formed inside of the ceramic substrate 21.

The heating element is provided with a resistance value and a heating capability changeable depending on the width and the thickness and both cases that the heating element is formed inside and on the surface, the above-mentioned ranges are respectively most practical. The resistance value is increased more if heating element becomes thinner in the thickness and in the width. As described above, both of the thickness and the width of the heating element are increased in the case of installation inside of the ceramic substrate as compared with those in the case of installation on the surface.

That is because: if the heating element is installed inside of the ceramic substrate, the distance between the heating face and the heating element becomes short and the evenness of the surface temperature is deteriorated and therefore the width of the heating element itself is needed to be widened. And also, owing to the installation of the heating element inside, it is no need to take the adhesion to the a nitride ceramic and the like into consideration, thus a high melting point metal such as tungsten, molybdenum and the like and carbides of tungsten, molybdenum and the like can be used and it makes the resistance value increase possible and accordingly the thickness may be thickened for the purpose to prevent disconnection. As a result, the heating element 12 is preferable to have a thickness and a width in the above-mentioned ranges.

Formation of the heating element on the surface of the ceramic substrate in the first aspect of the present invention is preferably carried out by a method involving steps of forming a conductor containing paste layer with a specified pattern by applying a metal particle-containing conductor containing paste to the surface of the ceramic substrate and then firing the pattern to sinter the metal particle on the surface of the ceramic substrate. The sintering of the metal is sufficient if each metal particle itself and the metal particle and the ceramic are melted and adhered with others. In that case, the conductor containing paste is not particularly limited, however it is preferable to contain the metal particle or a conductive ceramic for assuring the conductivity and, besides them, resin, a solvent, a thickener, a metal oxide and the like.

The above-mentioned metal particle is preferably of noble metals (gold, silver, platinum, palladium), lead, tungsten, molybdenum, nickel and the like. They may be used alone or in combination with two or more of them. Because these metals are relatively difficult to be oxidized and have sufficient resistance values to radiate heat. The above-mentioned conductive ceramic includes, for example, carbides of tungsten and molybdenum. They may be used alone or in combination with two or more of them.

The particle diameter of these metal particle and the conductive ceramic particle is preferably 0.1 to 100 $\mu$m. That is because if it is smaller than 0.1 $\mu$m, they are too fine and easy to be oxidized and contrary, if it exceeds 100 $\mu$m, sintering becomes difficult to result in increase of the resistance value. The shape of the above-mentioned metal particle may be spherical or scaly. In the case such metal particles are employed, mixtures of those with spherical shape and those with scaly shape may be employed. In the case the above-mentioned metal particle is a mixture of those with spherical shape and those with scaly shape, metal oxides mixed among metal particles are easy to be held to assure the adhesion of the heating element 12 to the nitride ceramic and the like and increase the resistance value and therefore it is advantageous.

The resin to be employed for the conductor containing paste includes, for example, epoxy resin, phenol resin and the like. The solvent is, for example, isopropyl alcohol and the like. The thickener may be cellulose and the like. The conductor containing paste is desirable, as described above, to contain the metal oxide together with the metal particle to make the heating element 12 be a sintered material of the metal particle and the metal oxide. By sintering the metal oxide and the metal particle as described, a nitride ceramic or a carbide ceramic, which is the ceramic substrate, is firmly bonded to the metal particle.

The technological reason for improvement of the adhesion of the metal particle to the nitride ceramic or carbide ceramic caused by adding the metal oxide as described is not made clear, yet it is supposedly attributed to that the metal particle surface, the surface of the nitride ceramic and carbide ceramic is slightly oxidized and oxide films are formed and these oxide films are united through the metal oxide by sintering to result in firm adhesion of the metal particle to the nitride ceramic and carbide ceramic.

The above-mentioned metal oxide is preferably selected from group consisting of, for example, lead oxide, zinc oxide, silica, boron oxide ($B_2O_3$), alumina, yttria, titania and the like. That is because these oxides can improve the adhesion property of the metal particle to the nitride ceramic and carbide ceramic without increasing the resistance value of the heating element.

The relative mixing ratios of the above-mentioned respective oxides such as lead oxide, zinc oxide, silica, boron oxide ($B_2O_3$), alumina, yttria, titania and the like are preferably to be adjusted within the respective ranges in the weight ratio; lead oxide 1 to 10, silica 1 to 30, boron oxide 5 to 50, zinc oxide 20 to 70, alumina 1 to 10, yttria 1 to 50, and titania 1 to 50; to the extent the total amount thereof does not exceed 100 parts by weight in the case the total amount of the metal oxides is set to be 100 parts by weight. The adhesion to particularly to the nitride ceramic can be improved by adjusting the amounts of the metal oxides within these ranges. The addition amount of the above-mentioned metal oxides to the metal particle is preferably not lower than 0.1% by weight and less than 10% by weight. The area resistivity of the heating element 12 formed using such a conductor containing paste is preferably 0.1 to $10\Omega/\square$. If the area resistivity is less than $0.1\Omega/\square$, in order to assure the heat radiation quantity, the width of the heating element pattern has to be as extremely thin as 0.1 to 1 mm and accordingly, slight defects of the pattern causes disconnection or changes of the resistance value, whereas if the area resistivity exceeds $10\Omega/\square$, the width of the heating element pattern has to be widened and the heat radiation quantity can not be assured and accordingly, the degree of option of the pattern design is narrowed to make it difficult to keep the temperature even on the heating face.

In the case the heating element 12 is formed on the surface of the ceramic substrate 11, a metal covering layer 24 (reference to FIG. 2) is desirable to be formed on the surface portion of the heating element 12. That is because the resistance value of the metal sintered body inside can be prevented from changing. In that case, the thickness of the metal covering layer is preferably 0.1 to 10 $\mu$m. The metal to be employed for the metal covering layer is not particularly limited if it is non-oxidative metal and practically, gold, silver, palladium, platinum, and nickel can be exemplified. They may be used alone and in combination of two or more of them.

Among them, nickel is preferable since the heating element 12 requires terminals to be connected with a power source and at the time of attachment of the terminals, which are attached to the heating element 12 through a solder, nickel can prevent thermal diffusion of the solder. An example of the connection terminal includes a terminal pin 13 made of Kovar In the case the heating element 22 is formed inside of the ceramic substrate 21, since the heating element surface is not oxidized, the coating is not required. In the case the heating element 22 is formed inside of the ceramic substrate 21, some portion of the heating element may be exposed to the surface and conductor-filled through holes to connect the heating element may be formed in the connection terminal parts and the connection terminals may be connected and fixed in the conductor-filled through holes. At that time, the solder for connecting the connection terminal to be employed may be alloys such as silver-lead, lead-tin, bismuth-tin. The thickness of the solder layer is preferably 0.1 to 50 $\mu$m. This is because it is sufficient range for assuring the connection by the solder.

Incidentally, in the ceramic heater of the first aspect of the present invention, other than that a semiconductor wafer is to be placed on the heating face of the ceramic substrate while being brought into contact with the heating face, the semiconductor wafer is supported by supporting pins or supporting balls to hold the semiconductor wafer at a constant distance from the ceramic substrate in some cases. The separation distance is preferably 5 to 5000 $\mu$m.

The semiconductor wafer can be received from a carrier machine, and placed on the ceramic substrate, or heated while being supported by lifter pins by moving the lifter pins up and down.

The diameter of the ceramic substrate of the first aspect of the present invention is preferably 200 mm or more. Particularly, 12 inch (300 mm) or more is preferable, because it will be main stream of a semiconductor wafer of the next generation.

Further, the outer shape of the above-mentioned ceramic substrate is preferable to be equal to or lager than the semiconductor wafer. Heating may be carried out in the state that the semiconductor wafer and the ceramic substrate does not contact each other.

Figure 6:
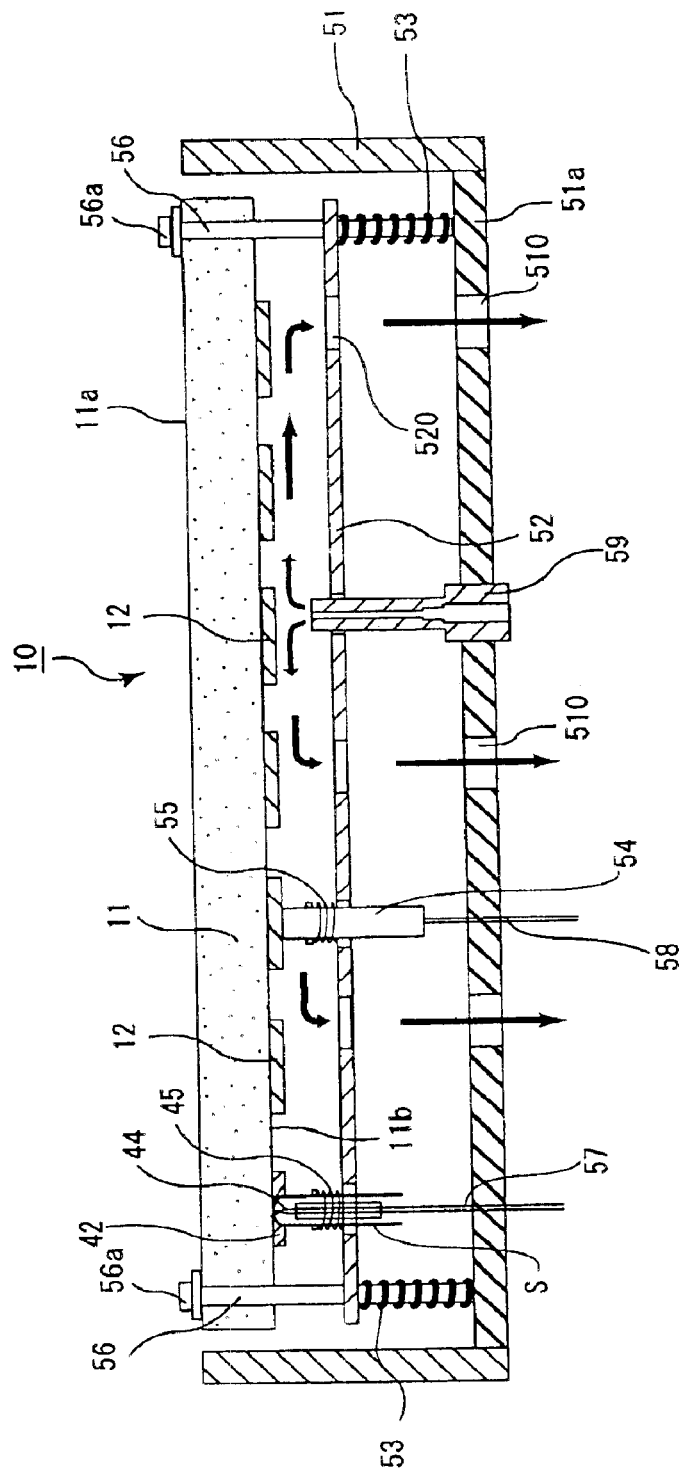
FIG. 6 is a sectional view schematically showing a structure of a hot plate unit of the present invention.

FIG. 6 shows a sectional view schematically showing the structure of the ceramic heater with the above-mentioned structure and housed in the supporting case. In this ceramic heater 10, the ceramic substrate is formed similarly to the ceramic substrate shown in FIGS. 1, 2, that is, an insulating layer, which is not shown, is formed on the surface (bottom face) of the ceramic substrate 11 and the heating element 12 is formed on the insulating layer.

In the inside of the supporting case 51, a plurality of bolt-shaped supporting columns 56 are stood and inserted into springs 53 and an intermediate bottom plate 52 is supported by the springs 53. To the heating element 12, power supply terminals 54 inserted into the springs 55 are pushed by the springs 55 placed on the intermediate bottom plate 52 to be connected with the heating element; and to the power supply terminals 54, conductive wires 58 are connected and the conductive wires are led out to the outside of the supporting case 51.

The thermocouples 44 housed in sheaths S are placed on the intermediate bottom plate 52 and pushed against the heat transmission plate 42 by the springs 45 into which the sheaths S are inserted. The heat transmission plate 42 is provided with dents having the same shape with that of the tip end of the sheaths and accordingly the thermocouple 44 are brought into contact with the ceramic substrate 11 through the heat transmission plate 42.

The supporting columns 56 are inserted in through holes formed in the peripheral part of the ceramic substrate 11 and the position of the ceramic substrate in the horizontal direction is fixed by them. On the other hand, the power supply terminals 54 are connected to the heating element 12 of the ceramic substrate and the sheaths S are brought into contact with the portion where the heat transmission plate 42 is arranged and the ceramic substrate 11 is pushed upward by the sheaths S and the power supply terminals 54. The head parts 56a of the supporting columns 56 are made to be T-shape and the ceramic substrate 11 pushed up by the sheaths S is engaged with the head parts 56a and fixed.

Further, cooling medium supply ports 59 are formed in the bottom plate 51a of the supporting case 51 and also openings 510 are formed to introduce a liquid, a gas, practically, water, an inert gas, air and the like, which is a cooling medium, through the cooling medium supply ports 59 and discharge it out of the openings 510 for cooling the ceramic substrate 11. Also, by formation of the openings 510, the reflection amount of the radiation heat can be suppressed.

Next, the manufacture method of the ceramic heater, particularly, the ceramic heater having a heating element on the bottom face of a ceramic substrate (that is, the ceramic heater with the structure shown in FIGS. 1 and 2) will be described along with FIGS. 1, 2.

A. Manufacture Method of Ceramic Heater Having Heating Element Formed on the Bottom Face of Ceramic Substrate (1) Manufacture of Ceramic Substrate After a slurry is produced by mixing the above-mentioned nitride ceramic or carbide ceramic such as aluminum nitride with a sintering aid such as yttria and the like, a binder and the like based on the necessity and the slurry is granulated by a method of spray dry to produce a granular powder and the obtained granular powder is filled in a die and molded to be a flat plate to obtain a raw formed body (a green sheet). Successively, based on the necessity, the raw formed body is processed by drilling to form through holes 15 to insert lifter pins for supporting a silicon wafer. After production of the ceramic substrate, the above-mentioned processing treatment may be carried out.

Next, the raw formed body is sintered by heating and firing to produce a plate-like body made of a ceramic. After that, the plate-like body is processed into a given shape to manufacture a ceramic substrate 11, and may be processed into a shape to be used as it is after firing. Heating and firing is carried out under the pressurizing condition so that manufacture of the ceramic substrate 11 free from pores is made possible. The heating and firing is carried out at a sintering temperature or higher and particularly in the case of the nitride ceramic or the carbide ceramic, it is 1000 to 2500° C. Further, an oxide ceramic film 500 is formed on the surface. Practically, the method to be employed includes: a sol-gel method of applying a sol solution containing ethyl silicate, water, and an acid, drying it and firing at 1000° C. or more; a method of applying a glass paste and firing it at 1000° C. or more; and a method of firing the surface of the ceramic substrate at 1000° C. or more in air to form an oxide film. A plate made of an oxide ceramic, for example, an alumina plate and a silica plate may be laminated.

After that, the ceramic substrate was ground with a diamond grind stone or polished with a diamond paste to adjust the surface roughness to $Ra \leq 5$ μm, desirably $Ra \leq 2$ μm.

(2) Step of Printing Conductor Containing Paste to Ceramic Substrate

As described above, the conductor containing paste is a fluid material containing generally a metal particle, resin, and a solvent and having a high viscosity. The conductor containing paste is printed on portions to form the heating element by a screen printing and the like to form a conductor containing paste layer. Since the heating element has to keep the whole body of the ceramic substrate at an even temperature, it is preferable to form a concentric pattern as shown in FIG. 1. The conductor containing paste layer is preferable to be have a rectangular and flat cross sectional shape as a heating element 12 after firing.

(3) Firing of Conductor Containing Paste Layer

The conductor containing paste layer printed on the bottom face of the ceramic substrate 11 is heated and fired to remove the resin and the solvent and at the same time sinter the metal particle and bake it on the bottom face of the substrate 11 to form the heating element 12. The temperature of the heating and firing is preferably 500 to 1000° C. If the above-mentioned metal oxide is added to the conductor containing paste, the metal particle, the ceramic substrate, and the metal oxide are sintered and integrated, so that the adhesion property of the heating element and the ceramic substrate is improved.

(4) Formation of Metal Covering Layer

It is preferable to form the metal covering layer 24 on the surface of the heating element 12. The metal covering layer 24 can be formed by a variety of means such as electroplating, electroless plating, sputtering and the like, yet in consideration of mass productivity, the electroless plating is optimum.

(5) Attachment of Terminal

Terminals (terminal pins 13) for connection with an electric power source are attached to the end parts of the pattern of the heating element 12 by a solder and further, as shown in FIG. 4, using springs, the temperature measurement elements are brought into contact with the ceramic substrate through sheaths and the heat transmission plate to complete the manufacture of the ceramic heater.

The above-mentioned manufacture method of the ceramic heater is a manufacture method of a ceramic heater comprising a ceramic substrate and a heating element formed on the bottom face of the ceramic substrate and therefore, next a manufacture method of the ceramic heater comprising a ceramic substrate and a heating element formed inside of the ceramic substrate will be described.

B. Manufacture Method of Ceramic Heater Having Heating element Formed in Inside of Ceramic Substrate (1) Manufacture of Ceramic Substrate At first, a paste is produced by mixing a powder of the nitride ceramic or carbide ceramic with a binder and a solvent and formed in a sheet-like state by a doctor blade method to obtain a green sheet. The thickness of the green sheet is preferably 0.1 to 5 mm.

In this case, aluminum nitride, silicon carbide and the like may be used for the ceramic powder and based on the necessity, a sintering aid of such as yttria and the like may be added. The binder is preferably at least one kind of binders selected from a group consisting of an acrylic-based binder, ethyl cellulose, butyl cellosolve, and polyvinyl alcohol. Further, the solvent is preferably at least one kind of binders selected from a group consisting of α-terpineol and glycol.

Next, based on the necessity, portions to be through holes to insert the lifter pins into for supporting an object to be heated such as a silicon wafer and the like and portion to be conductor-filled through holes for connecting the heating element to external terminal pins are formed. This processing may be carried out after the formation of green sheet laminate body, which will be described later, or after the production of the sintered body.

(2) Step of Printing Conductor Containing Paste to Green Sheet

The conductor containing paste containing a metal or a conductive ceramic is printed on the green sheet. In the conductor containing paste, the metal particle or the conductive ceramic particle is contained. The metal particle is preferably a tungsten particle or a molybdenum particle and the average particle diameter of the metal particle is preferably 0.1 to 5 μm. This is because if the average particle diameter is smaller than 0.1 μm or larger than 5 μm, the conductor containing paste is difficult to be printed. Such a conductor containing paste include a composition (paste) containing, for example, 85 to 87 parts by weight of the metal particle or a conductive ceramic particle; 1.5 to 10 parts by weight of at least one kind of binders selected from a group consisting of an acrylic-based binder, ethyl cellulose, butyl cellosolve, and polyvinyl alcohol; and 1.5 to 10 parts by weight of at least one kind of solvents selected from a group consisting of α-terpineol and glycol.

(3) Green Sheet Lamination Step

Green sheets having no printing of the conductor containing paste are laminated on the upper and the lower side of the green sheet bearing the printing of the conductor containing paste. In this case, the number of the green sheets to be laminated on the upper side is controlled to be larger than the number of the green sheets to be laminated on the lower side in order to make a formed position of the heating element prejudised in the direction to the bottom face. Practically, the number of the green sheets to be laminated on the upper side is preferably 20 to 50 sheets and the number of the green sheets to be laminated on the lower side is 5 to 20 sheets.

(4) Firing Step of Green Sheet Laminated Body

The green sheet laminated body is heated and pressurized to sinter the green sheets and the conductor containing paste layer inside. The heating temperature is preferably 1000 to 2000° C. and the pressurizing pressure is preferably 100 to 200 kg/cm$^2$. Heating is carried out in an inert gas atmosphere. The inert gas to be employed includes argon, nitrogen and the like.

Further, a film 500 of an oxide ceramic is formed on the surface. Practically, the method to be employed includes a sol-gel method of applying a sol solution containing ethyl silicate, water, and an acid, drying it and firing it at 1000° C. or more, a method of applying a glass paste and firing it at 1000° C. or more, a method of firing the surface of the ceramic substrate at 1000° C. or more in the air to form an oxide film. A plate made of an oxide ceramic, for example, an alumina plate and a silica plate may be laminated.

After that, the ceramic substrate is ground with a diamond grindstone or polished with a diamond paste to adjust the surface roughness to be Ra$\leq$5 μm, preferably Ra$\leq$2 μm.

Further, terminals are connected to the conductor-filled through holes to be connected with the heating element inside thereof and heated to carry out reflow. The heating temperature is preferably 200 to 500° C. Further, the thermocouples as temperature measurement elements are fixed by heat resistant resin or a ceramic or brought into contact by springs as shown in FIG. 4 to complete manufacture of the ceramic heater.

The ceramic heater of the first aspect of the present invention is characterized in that the heating element is formed on the surface or the inside of the ceramic plate and temperature measurement elements are attached and fixed by the heat resistant resin or the ceramic or by being pushed by springs and the like, and yet it is desirable to further install control unit for supplying electric power to the above-mentioned heating element, a memory unit for storing the temperature data measured by the above-mentioned temperature measuring element, and a computation unit for computing the necessary electric power for the above-mentioned heating element from the above-mentioned temperature data to obtain a ceramic heater apparatus.

By adopting the installation as mentioned above, the measurement results of the temperature are stored in the memory unit, and based on the stored temperature data, the computation unit computes the voltage to be applied to the heating element for even heating and based on the computation results, the controlled voltage is applied to the heating element from the control unit, so that the whole body of an object to be heated such as a silicon wafer can evenly be heated.

Further, the nitride ceramic and carbide ceramic have a smaller thermal expansion coefficient than a metal and significantly high mechanical strength than a metal, so that the ceramic substrate can be made thin and light. Further, the ceramic substrate has a high thermal conductivity and the ceramic substrate itself is thin, so that the surface temperature of the ceramic substrate can promptly follow the temperature change of the heating element.

FIG. 3 shows a ceramic heater apparatus equipped with the control unit for supplying electric power to the heating element, a memory unit for storing the temperature data measured by the above-mentioned temperature measureing element, and a computation unit for computing the necessary electric power for the above-mentioned heating element from the above-mentioned temperature data and in the figure, the ceramic heater is a shown as the partial cross-sectional view and the other facilities installed in the ceramic heater are shown in block line figures.

Different from the case of FIG. 1, in the ceramic heater shown in the figure, the heating element 22 (22x, 22y) is formed inside thereof and is not composed of pairs of double concentric circles but composed of concentric circles composed of single circles. The heating elements 22x, 22y are connected to the terminal pins 13 formed on the bottom faces through the conductor-filled through holes 28. Further, to the terminal pins 13, sockets 32 are attached and the sockets 32 are connected to the control unit 29 having an electric power source.

Further, the thermocouples 27 are fixed in the ceramic substrate 21. The thermocouples 27 are connected to the memory unit 30 so as to measure the temperature at the respective thermocouples 27 for every given interval and store the data. The memory unit 30 is connected to the control unit 29 and also to the computation unit 31, and based on the data stored in the memory unit 30, the computation unit 31 computes the voltage values and the like for the control and based on the computation result, the control unit 29 applies given voltage to the heating element 22 to make the temperature of the heating face 21a even.

Further, a plurality of through holes 25 (in the figure, only one) are formed in the ceramic substrate 21. The lifter pins 16 are inserted into the through holes 25 and an object to be heated, e.g., a silicon wafer 19, is to be placed on the lifter pins 16. By moving the lifter pins 16 up and down, the silicon wafer 19 is made possible to be transported to an un-illustrated carrier machine or received from the carrier machine. The respective members composing the ceramic heater 10 and temperature measurement elements formed in the substrate 11 are similarly constituted to those of the ceramic heater of FIG. 1, except the points particularly described above and thus their detailed description is omitted.

Next, the operation of the ceramic heater of the first aspect of the present invention will be described with the reference to the ceramic heater of FIG. 3 having the structure where the heating element is buried in the ceramic substrate.

At first, when electric power is applied to the ceramic heater 10 by operating the control unit 29, the temperature of the ceramic heater 21 itself increases and the surface temperature of the outer circumferential part becomes slightly low. The thermocouples 27 measure the change of the temperature and the data of the measured temperature is once stored in the memory unit 30.

After that, the measured temperature data is transmitted to the computation unit 31 and in the computation unit 31, the temperature difference ΔT among the respective measurement points is computed and further the data ΔW necessary to make the temperature on the heating face 21a even is computed. For example, if the temperature difference ΔT exists between the heating element 22x and the heating element 22y and the temperature is lower in the heating element 22x, the electric power data ΔW so as to make ΔT 0 is computed and transmitted to the control unit 29 and based on the data, electric power is applied to the heating element 22x to increase the temperature thereof.

Regarding the electric power calculation algorithm, it is most convenient to employ a computation method for computing the electric power necessary for temperature increase based on the specific heat of the ceramic substrate 21 and the weight of the heating region and a correction coefficient attributed to the heating element pattern may be added. Also, previously a temperature increase test is carried out for specified heating element patterns to previously obtain the function among the temperature measurement positions, the loaded electric power, and the temperature, and the electric power to apply may be computed from the function. The voltage for application corresponding to the electric power computed in the computation unit 31 and the time are transmitted to the control unit 29 and in the control unit 29, electric power is applied to each heating element 22 based on the values.

The ceramic heater shown in FIG. 1 and FIG. 2(a), similarly to the ceramic heater shown in FIG. 3, is a ceramic heater equipped with: a control unit for supplying electric power to the heating element; a memory unit for storing the temperature data measured by the above-mentioned temperature measuring element; and a computation unit for computing the necessary electric power for the above-mentioned heating element from the above-mentioned temperature data. And unlike the case of heating element in FIG. 3, the heating element is not embedded in the ceramic substrate but installed on the bottom face of the ceramic substrate. FIG. 2(b) is a partially enlarged sectional view of some portion of the ceramic heater, particularly the temperature measurement element. In the surrounding of the heating elements 12x, 12y formed on the bottom face 11b of the ceramic substrate 11, a metal covering layer 24 is formed and terminal pins 13 are connected to and fixed to the heating elements 12x and 12y through the metal covering layer 24. Sockets 32 are attached to the terminal pins 13 and the sockets 32 are connected to the control unit 23 having an electric power source. Other than that, the ceramic heater is composed similarly to the ceramic heater shown in FIG. 3.

Operation of the ceramic heater 10 shown in FIG. 1 and FIG. 2 is also similar to the ceramic heater shown in FIG. 3 and the temperatures at two thermocouples 27 are measured for every given interval and the data are stored in memory unit 21, and based on the data, the computation unit 22 computes the voltage values and the like for the control, and based on the computation results, the control unit 23 applies given voltage to the heating elements 12x, 12y to make the temperature of the whole heating face 11a even.

Next, the ceramic heater for a semiconductor producing/examining device according to the second aspect of the present invention will be described along with an embodiment of the present invention.

The ceramic heater for a semiconductor producing/examining device according to the second aspect of the present invention is a ceramic heater comprising a ceramic heater and a heating element formed on the surface of the ceramic substrate or inside of the ceramic substrate, and is characterized in that temperature measurement elements are pressed on the above-mentioned ceramic substrate.

The insulating layer to be used for the second aspect of the present invention is same as that used in the first aspect of the present invention.

In the second aspect of the present invention, the surface roughness Ra of the ceramic substrate being brought into contact with the temperature measurement elements is preferably Ra≦5 μm, more preferably Ra≦2 μm. Therefore, similarly to the case of the first aspect of the present invention, the surface of the ceramic substrate is made smooth by grinding or forming an insulating layer with the roughness Ra≦5 μm.

The properties of the above-mentioned insulating layer such as the size and the thickness, are same as those of the first aspect of the present invention.

In this specification, the fact that the roughness of the surface of the ceramic substrate is adjusted to be Ra≦5 μm includes that the roughness Ra of the surface of the insulating layer is adjusted to be 2 μm or less.

The temperature measurement elements are preferable to be pushed by a force of $1 \times 10^{-6}$ to 20 kg. If the pressing force is less than $1 \times 10^{-6}$ ($9.8 \times 10^{-6}$ N), the contact of the temperature measurement elements and the ceramic substrate is not sufficient and the response at the time of measurement is inferior and the controllability of the temperature of the heating face of the ceramic substrate is decreased and accordingly, the temperature distribution of the heating face becomes wide to result in difficulty of even heating of a silicon wafer.

If the pressing force exceeds 20 kg (196 N), the ceramic substrate is warped and in the case of heating in the state the heating face and the silicon wafer are brought into contact with each other, the heating face and the silicon wafer are not sufficiently brought into contact with each other and on the other hand, in the case of heating in the state the heating face and the silicon wafer are distanced from each other, the distance between the heating face and the silicon wafer is not constant and accordingly the semiconductor wafer cannot be heated at an even temperature.

Note that the pressing force is measured by a gravimeter.

Similarly to the first aspect of the present invention, the insulating layer may be formed on the whole ceramic substrate or only on the portions where the temperature measurement elements contact. In the case the insulating layer is formed on the whole ceramic substrate, the heating element may be formed on the insulating layer.

Similarly to the first aspect of the present invention, in the second aspect of the present invention, for instance as shown in FIG. 5, a thermocouple 44 may be housed in a sheath S made of a stainless steel and an insulating powder 46 such as alumina, silica, magnesia and the like is sealed therein and the resulting sheath S as a whole may be pressed on the surface of the ceramic substrate 11 bearing the insulating layer 500 by the force of a spring 45 as shown in FIG. 4. In this case, a projection 48 may be formed on the side face of the sheath S and the spring 45 is installed between the projection 48 and the plate-like body 41 which is either the bottom plate or an intermediate bottom plate. The spring 45 may be like a coil or a leaf as shown in FIG. 4.

In this case, the sheath S housing the temperature measurement element such as the thermocouple 44 may be fitted and fixed in an alumina pipe so as to be brought into contact with the ceramic substrate 11 and also as shown in FIG. 4, a heat transmission plate 42 made of a metal plate and the like may be interposed between the sheath S containing the thermocouple 44 and the insulating layer 500 to increase the thermal conductivity. As the metal plate, aluminum, a stainless steel, nickel, copper, a noble metal and the like may be used.

Further, as shown in FIG. 4, in order to make the contact surface area of the heat transmission plate 42 and the sheath S large, a dent (concave portion) having the similar shape to that of the tip end of the sheath S is preferable to be formed in the heat transmission plate 42.

For the sheath S, other than metals, a ceramic such as alumina may be used. However, to avoid deterioration of the response of the temperature measurement element by the existence of sheath S, the thickness and the material thereof are required to be controlled and selected.

Figure 10:
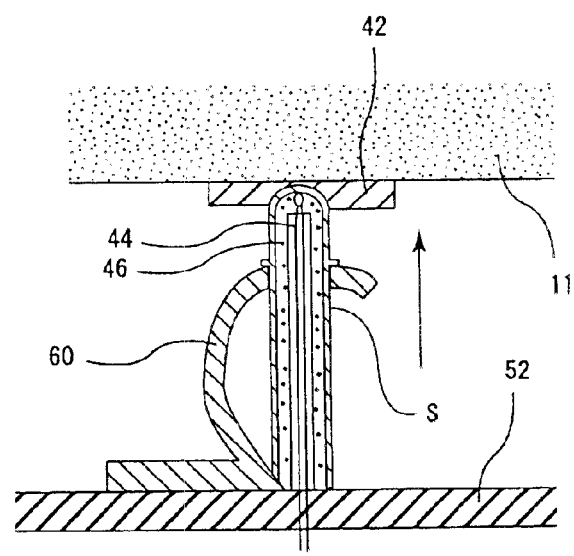
FIG. 10 is a sectional view schematically showing one example of a contact structure of a temperature measurement element in a ceramic heater of the present invention.

As shown in FIG. 10, the sheath S housing the temperature measurement element such as the thermocouple 44 may be fitted and fixed in a leaf spring 60 made of a metal such as Kovar, a steel and the like and pressed on the ceramic substrate 11 through a heat transmission plate 42. The shape of the leaf spring 62 is not particularly limited, yet as shown in FIG. 10, the leaf spring 60 which is bent so as to have a cross-section approximately like numeral "2"-shape and have through hole to insert the sheath S into may be employed.

Figure 11:
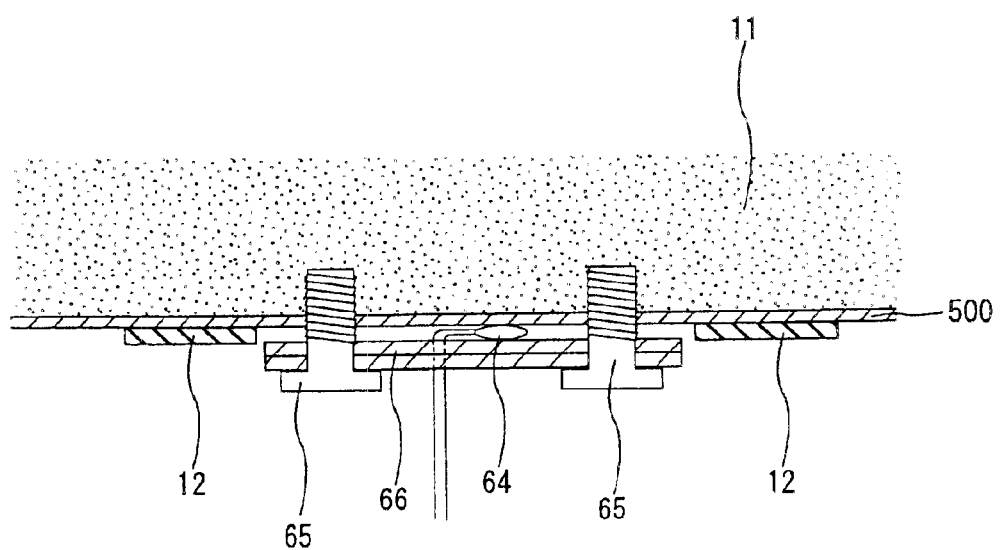
FIG. 11 is a sectional view schematically showing one example of a contact structure of a temperature measurement element in a ceramic heater of the present invention.

Further, as shown in FIG. 11, the temperature measurement element (thermocouple) 64 may be sandwiched between a presser plate 66 and the ceramic substrate 11 and fastened by a bolt 65 to be fixed.

Figure 12:
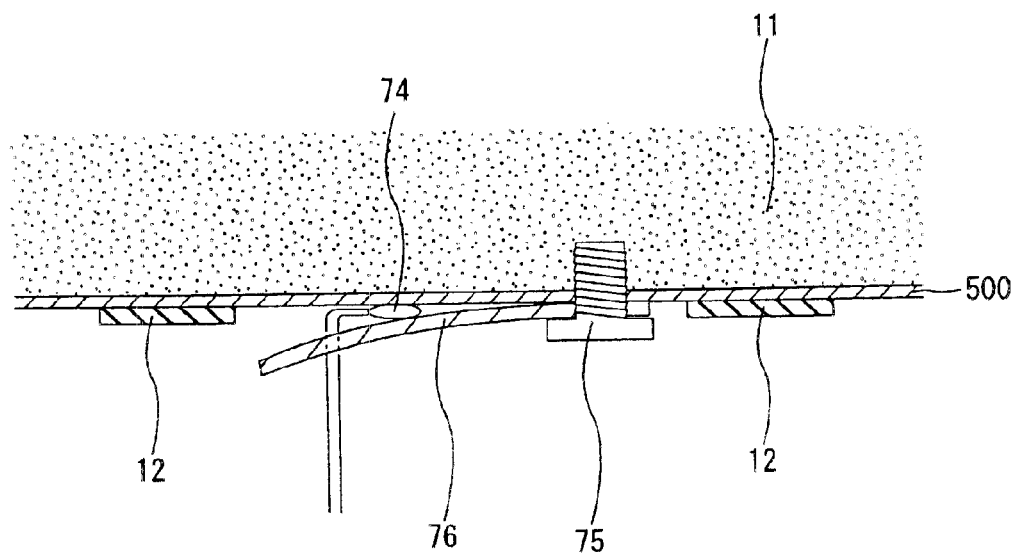
FIG. 12 is a sectional view schematically showing one example of a contact structure of a temperature measurement element in a ceramic heater of the present invention.
Figure 13:
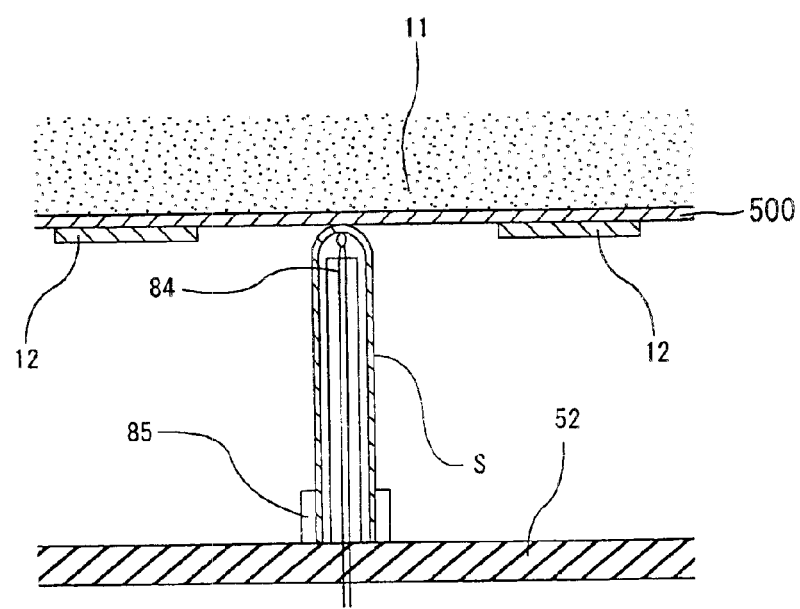
FIG. 13 is a sectional view schematically showing one example of a contact structure of a temperature measurement element in a ceramic heater of a comparative example.

Further, as shown in FIG. 12, one side of a leaf spring 76 is fixed by a bolt 75 and the like and the temperature measurement element (thermocouple) 74 is attached to the other end to be pressed.

Since the second aspect of the present invention employs the above-mentioned means, no fixing member such as an adhesive and the like is required and as a result, there is no probability of occurrence of the thermal deterioration of the fixing member and therefore the temperature measurement element does not fall attributed to the deterioration. Also, different from the fixation method using an adhesive, in the manufacturing process, any problem such as inferior contact with the ceramic substrate does not take place and accurate temperature measurement of an object to be heated is made possible and based on the temperature measurement results, the heating state of the heating element can properly be adjusted to make the even heating of the whole body of a variety of objects to be heated possible.

The above-mentioned ceramic substrate and the temperature measurement element composing the ceramic heater of the second aspect of the present invention may be brought into contact with each other through a heat transmission plate made of a material such as a nitride ceramic and the like, a carbide ceramic and the like other than the above-mentioned metal plate. The heat transmission plate of such a metal plate and the like has a high thermal conductivity and is capable of improving the response to the thermocouple. Also, as described above, if the contact surface area with the thermocouple is made wide by forming a dent in the heat transmission plate 42, the response can further be improved.

Further, the ceramic substrate holding the heating element and made of the nitride ceramic and carbide ceramic has a smaller thermal expansion coefficient than a metal and significantly high mechanical strength than a metal, so that even if the ceramic substrate can be made thin and light in weight, it is not warped or distorted by heating. Further, the ceramic substrate has a high thermal conductivity and the ceramic substrate itself is thin, so that the surface temperature of the ceramic substrate can promptly follow the temperature change of the heating element. That is, the surface temperature of the ceramic substrate can accurately be controlled by changing the temperature of the heating element by changing the voltage and current values.

As described above, the ceramic heater of the second aspect of the present invention is a ceramic heater comprising a ceramic substrate and a heating element on the surface of the ceramic substrate or inside of the ceramic substrate. The summary of the ceramic heater will be described along with FIG. 8.

Figure 8:
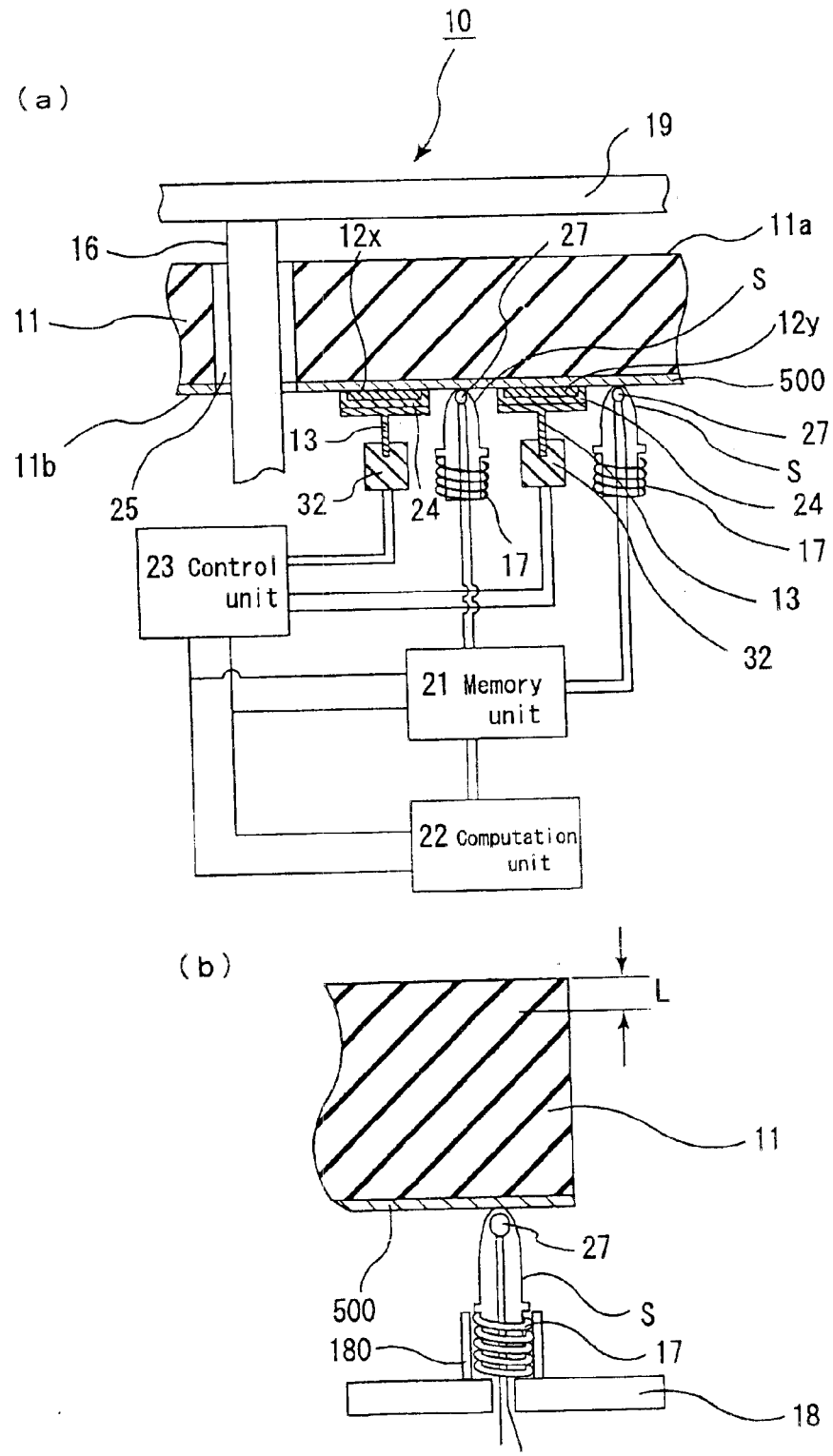
FIG. 8(a) is a block diagram schematically showing a ceramic heater of a second aspect of the present invention in which a heating element is formed on a bottom face of a ceramic substrate.
FIG. 8(b) is a partially enlarged sectional view showing a part at which a thermocouple of the above-mentioned ceramic heater is installed.

FIG. 8(*a*) is a block diagram schematically showing a ceramic heater of a second aspect of the present invention and FIG. 8(*b*) is a sectional view showing the part having a temperature measurement element.

The bottom face view of the ceramic heater shown in FIG. 8 is approximately same as the one described in FIG. 1, so that here the description is omitted. FIG. 8(*a*) shows some portion of the cross-section of the ceramic substrate shown in FIG. 1.

FIG. 8 is approximately same as FIG. 2, except the contact structure of the ceramic substrate 11 and the thermocouple 27. Accordingly, same reference numerals are assigned to the constituent elements corresponding to those in the above-mentioned FIG. 2.

As shown in FIG. 8, terminal pins 13 to be input and output terminals are connected to both ends of the heating element 12. Through holes 15 to insert lifter pins 16 into for holding a variety of objects to be heated such as a silicon wafer on the heating face are formed near the center portion and in the temperature measurement portions 14*a* to 14*i*, sheaths S housing the thermocouples 27 therein are pushed against the bottom face 11*b* of the ceramic substrate 11 using springs 17 and brought into contact with the bottom face 11*b*.

As shown in FIG. 8(b), the springs 17 are disposed in the insides of cylindrical bodies 180 uprightly stood in the intermediate bottom plate 18 and the sheaths S are inserted into the springs 17 and the springs 17 push up the projections formed on the side faces of the sheaths S, so that the sheaths S are brought into contact with the insulating layer 500 formed on the ceramic substrate 11.

The shape (the thickness and the diameter) and the material (raw material) of the ceramic substrate composing the ceramic heater of the second aspect of the present invention are similar to those of the first aspect of the present invention and already described and therefore description here is omitted.

As shown in FIG. 8, the insulating layer 500 is formed on the bottom face 11*b* of the ceramic substrate 11 and the temperature measurement elements such as thermocouples 27 are brought into contact with the insulating layer 500 to measure the temperature of the ceramic substrate 11.

The temperature measurement elements to be employed in the ceramic heater of the second aspect of the present invention are similar to those of the first aspect of the present invention and already described and therefore description here is omitted. The above-mentioned temperature measurement elements are arranged in the temperature measurement portions 14*a* to 14*i* and, as described above, pushed against the bottom face 11*b* of the ceramic substrate 11 using the elastic bodies such as the springs 17.

Figure 9:
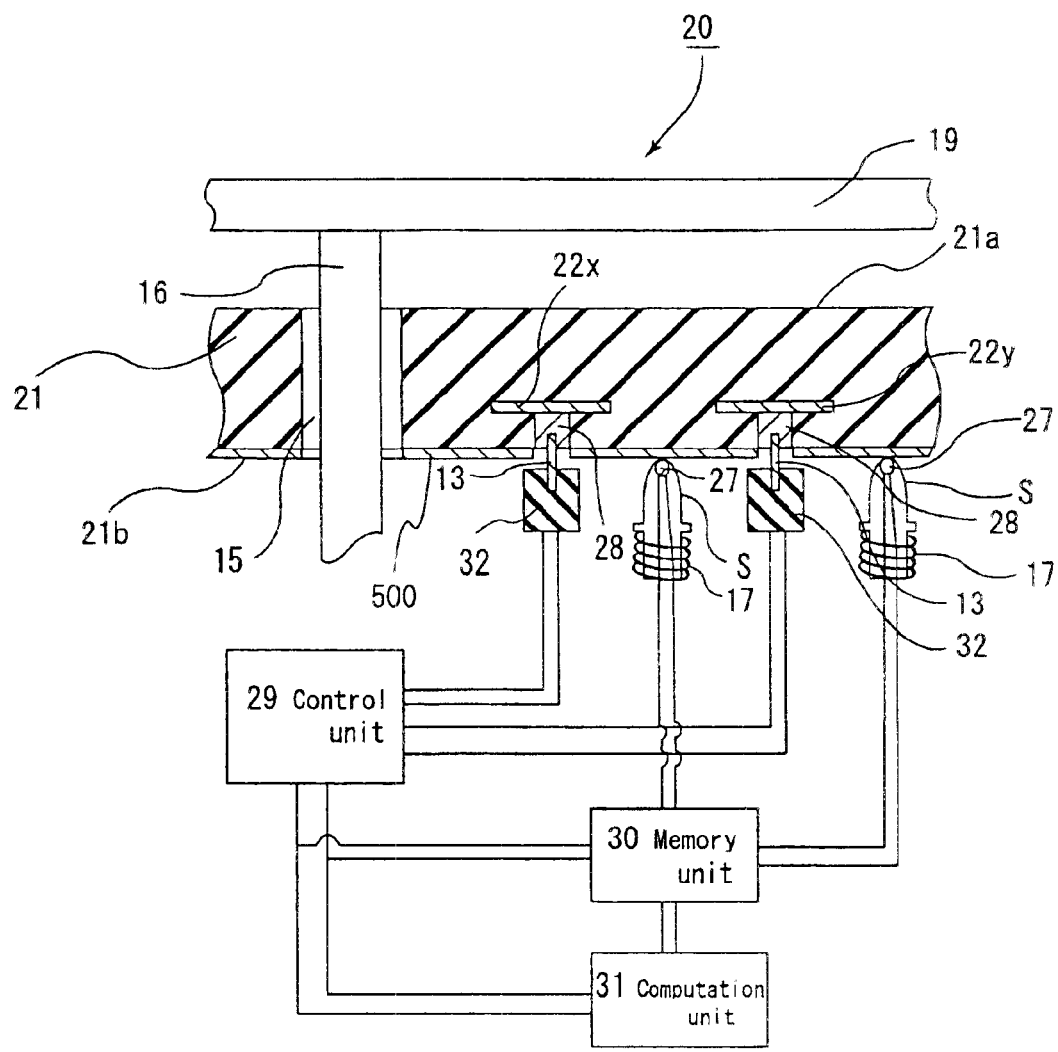
FIG. 9 is a block diagram schematically showing a ceramic heater of a second aspect of the present invention in which a heating element is provided inside of a ceramic substrate.

Similarly to the first aspect of the present invention, the heating element of the above-mentioned ceramic heater may be formed on the bottom face 11*b* of the ceramic substrate 11, as shown in FIG. 8, or inside of the ceramic substrate 21, as shown in FIG. 9. The formation position of the heating element 22 in the case the heating element 22 is formed inside of the substrate 21 is same as that in the first aspect of the present invention and already described and therefore description here is omitted.

The shape, the material, and the formation method of the above-mentioned heating element are similar to those of the first aspect of the present invention and already described and therefore description here is omitted.

In the ceramic heater of the second aspect of the present invention, other than the case of mounting a semiconductor wafer while bringing the wafer into contact with the heating face of the ceramic substrate, the semiconductor wafer maybe supported and heating may be carried out as the semiconductor wafer is being supported with a constant distance kept from the ceramic substrate. The distance is desirably 5 to 5000 μm.

The semiconductor wafer can be received from the conveyor, placed on the ceramic substrate, and also heated by longitudinally moving the lifter pin.

The ceramic heater of the second aspect of the present invention with the above-mentioned structure is generally used while being housed in a supporting case. The situation of the ceramic heater of the second aspect of the present invention which is housed in the supporting case is same as shown in FIG. 6. FIG. 6 is already described and therefore description here is omitted.

The manufacturing method of the ceramic heater of the second aspect of the present invention, particularly, the ceramic heater comprising a ceramic substrate and a heating element formed on the bottom face of the ceramic substrate (that is, the ceramic heater with the structure shown in FIGS. 1 and 8) is similar to the above-mentioned A. of the first aspect of the present invention, except that the surface roughness adjustment of the ceramic substrate is not necessary and is already described and therefore description here is omitted.

Also, the manufacturing method of the ceramic heater comprising a ceramic substrate and a heating element formed inside of the ceramic substrate is similar to the above-mentioned B. of the second aspect of the present invention, except the surface roughness adjustment of the ceramic substrate is not necessary and is already described and therefore description here is omitted.

The ceramic heater of the second aspect of the present invention is characterized in that the heating element is formed on the surface or the inside of the ceramic substrate and the temperature measurement elements are installed and fixed by pushing them by springs and similarly to the first aspect of the present invention, other than these, control unit for supplying electric power to the above-mentioned heating element, a memory unit for storing the temperature data measured by the above-mentioned temperature measurement elements, and a computation unit for computing the necessary electric power for the above-mentioned heating element from the above-mentioned temperature data are preferable to be installed to obtain a ceramic heater apparatus.

FIG. 9 shows the ceramic heater apparatus comprising the ceramic substrate, control unit for supplying electric power to the heating element, a memory unit for storing the temperature data measured by the above-mentioned temperature measurement elements, and a computation unit for computing the necessary electric power for the above-mentioned heating element from the above-mentioned temperature data. In this figure, the ceramic heater is shown as a partial cross-sectional view and the facilities other than the elements of the ceramic heater are shown as block line figures. The FIG. 9 is similar to FIG. 3 except the contact structure of the ceramic substrate 21 and the thermocouples 27. Therefore, the same reference numerals are assigned to the constituent components in FIG. 9 which are corresponding in FIG. 3.

Different from that in FIG. 8, the ceramic heater shown in the figure, the heating element 22 (22x, 22y) is embedded inside of the ceramic substrate 21 and also different from that in FIG. 8, the heating element 22 (22x, 22y) is not composed of pairs of double concentric circles but composed of concentric circles composed of single circles. The heating elements 22x, 22y are connected to the terminal pins 13 formed on the bottom faces through the conductor-filled through holes 28. Further, to the terminal pins 13, sockets 32 are attached and the sockets 32 are connected to the control unit 29 having an electric power source.

Further, the sheaths S housing the thermocouples 27 therein are fixed in the ceramic substrate 21 while being brought into contact with the ceramic substrate. The thermocouples 27 are connected to the memory unit 30 so as to measure the temperature at the respective thermocouples 27 for every given interval and store the data. The memory unit 30 is connected to the control unit 29 and also to the computation unit 31 and based on the data stored in the memory unit 30, the computation unit 31 computes the voltage values and the like for the control and based on the computation result, the control unit 29 applies given voltage to the heating element 22 to make the temperature of the heating face 21a even.

Regarding the respective members composing the ceramic heater 20 and the temperature measurement elements formed in the ceramic substrate 21, the members other than those particularly described above are similarly constituted to those of the ceramic heater shown in FIG. 8 and already described and therefore description here is omitted.

Further, the operation of the ceramic heaters of the second aspect of the present invention shown in FIG. 8 and FIG. 9 is also similar to that described for the above-mentioned first aspect of the present invention and already described and therefore description here is omitted.

BEST MODE FOR CARRYING OUR THE INVENTION

Hereinafter, the present invention will be described further in detail along with examples of the present invention, yet it is no need to say that the present invention is not at all limited to these examples and it is therefore comprehended that the claims will cover any modifications or embodiments as fall within the true scope of the present invention.

EXAMPLE 1

Manufacture of Ceramic Heater Made of Aluminum Nitride (Reference to FIG. 1)

(1) A composition containing 100 parts by weight of an aluminum nitride powder (the average particle diameter: 1.1 μm), 4 parts by weight of yttria (the average particle diameter: 0.4 μm), 12 parts by weight of an acrylic binder, and an alcohol was spray dried to produce a granular powder.

(2) Next, the obtained granular powder was filled in a die and molded to be a flat plate to obtain a raw formed body (a green sheet). The raw formed body was processed by drilling to form through holes 15 to insert lifter pins for a silicon wafer.

(3) On completion of the processing, the raw formed body was hot pressed at 1800° C. and a pressure of 200 kg/cm² to obtain a 3 mm thick aluminum nitride plate-like body. Next, a disk with a diameter of 12 inch (300 mm) was cut out of the plate-like body to obtain a plate-like body made of ceramic (a ceramic substrate) 11. Further, a glass paste (G-5177 produced by Shouei Chemical Products Co., Ltd.) was applied to the surface and heated to 1000° C. to form a 2 μm-thick SiO$_2$ film.

The ceramic substrate 11 was ground with a diamond grind stone of #220 at 1 kg/cm$^2$ load and polished with a polishing cloth (Malto Co.) and a diamond paste (particle diameter of 0.5 μm) to adjust the surface roughness to Ra=0.01 μm. Incidentally, the measurement of the surface roughness was carried out by a probe type surface roughness meter (Surfcom 920A, Tokyo Precision Co.).

(4) On the ceramic substrate 11 obtained as described above-mentioned (3), a conductor containing paste was printed by screen printing. The printed pattern was made to be a concentric pattern as shown in FIG. 1. As the conductor containing paste, Sorbest PS603D produced by Tokuriki Chemical Research Co., Ltd. used to form a plated through hole of a printed circuit board was used. The conductor containing paste was a silver-lead paste and contained 7.5 parts by weight of metal oxides consisting of lead oxide (5% by weight), zinc oxide (55% by weight), silica (10% by weight), boronoxide (25% by weight), and alumina (5% by weight) in 100 parts by weight of Ag. The silver particle had an average particle diameter 4.5 μm and a scaly shape.

(5) Next, the ceramic substrate 11 bearing the printed conductor containing paste was heated and fired at 780° C. to sinter silver and lead in the conductor containing paste and simultaneously bake them on the ceramic substrate 11 to form a heating element 12. The silver-lead heating element 12 had a thickness of 5 μm, a width of 2.4 mm and an area resistivity of 7.7 mΩ/□.

(6) Next, the ceramic substrate 11 produced as described in (5) was immersed in an electroless nickel plating bath of an aqueous solution containing 80 g/L of nickel sulfate, 24 g/L of sodium hypophosphite, 12 g/L of sodium acetate, 8 g/L of boric acid, and 6 g/L of ammonium chloride to deposit a 1 μm-thick metal covering layer (nickel layer) 24 on the surface of the silver-lead heating element 12.

(7) To the portions where terminals for assuring the connection with an electric power source, a silver-lead solder paste (Tanaka Noble Metals. Co.) was applied by screen printing to form a solder layer.

Then, terminal pins 13 made of Kovar were attached on the solder layer and the solder was heated for reflow at 420° C. to attach the terminal pins 13 to the surface of the heating element 12.

(8) Thermocouples for temperature control were fixed by polyimide resin and the resin was cured at 190° C. for 2 hours to obtain a ceramic heater 10.

EXAMPLE 2

Manufacture of Ceramic Heater Made of Silicon Carbide

A ceramic heater made of silicon carbide was manufactured in the same manner as Example 1, except that silicon carbide with an average particle diameter of 1.0 μm was used and the sintering temperature was 1900° C. and further, the obtained ceramic substrate surface was fired at 1500° C. for 2 hours to form a 1 μm-thick SiO$_2$ layer on the surface.

The substrate was ground with a diamond grind stone of #220 at 1 kg/cm$^2$ load and polished with a polishing cloth (Malto Co.) and a diamond paste (particle diameter of 0.25 μm) to adjust the surface roughness to Ra=0.008 μm.

To the substrate, sheaths S housing thermocouples 44 as shown in FIG. 4 were pushed with springs 45.

EXAMPLE 3

Manufacture of Ceramic Heater Containing Heating Element Inside (Reference to FIG. 3)

(1) Using a paste produced by mixing an aluminum nitride powder (the average particle diameter: 1.1 μm produced by Tokuyama), 4 parts by weight of yttria (the average particle diameter: 0.4 μm), 11.5 parts by weight of an acrylic binder, 0.5 parts by weight of a dispersant, and 53 parts by weight of alcohol consisting of 1-butanol and ethanol, forming was carried out by a doctor blade method to obtain a 0.47 mm green sheet.

(2) Successively, after the green sheet was dried at 80° C. for 5 hours, portions to be through holes 15 with diameters of 1.8 mm, 3.0 mm, and 5.0 mm to insert silicon wafer lifter pins into and portions to be conductor-filled through holes for connection with terminal pins were formed by punching.

(3) Next, a conductor containing paste A was produced by mixing 100 parts by weight of a tungsten carbide particle with an average particle diameter of 1 μm, 3.0 parts by weight of an acrylic binder, 3.5 parts by weight of α-terpineol solvent, and 0.3 parts by weight of a dispersant.

Further, a conductor containing paste B was produced by mixing 100 parts by weight of a tungsten carbide particle with an average particle diameter of 1 μm, 1.9 parts by weight of an acrylic binder, 3.7 parts by weight of α-terpineol solvent, and 0.2 parts by weight of a dispersant.

(4) Using the conductor containing paste A, printing on the green sheet was carried out by a screen printing to form a conductor containing paste layer. The printed pattern was made to be a concentric pattern as shown in FIG. 1. Further, the through holes for forming conductor-filled through holes for connection with terminal pins were filled with the conductor containing paste B. On the green sheet finished for the above-mentioned treatment, 37 green sheets and 13 sheets with no printing with the tungsten paste were laminated on the upper side (heating face) and on the lower side, respectively, and laminated at 130° C. and 80 kg/cm$^2$ pressure.

(5) The laminated body obtained in such a manner was degreased at 600° C. for 5 hours in nitrogen gas and hot pressed at 1890° C. and 150 kg/cm$^2$ pressure for 3 hours to obtain a 3 mm-thick aluminum nitride plate-like body. The obtained plate-like body was cut into a disk-like shape with a diameter of 300 mm to obtain a plate-like body made of a ceramic containing a heating element with a thickness of 6 μm and a width of 10 mm inside.

A sol solution produced by hydrolysis polymerization of a mixed solution containing 25 parts by weight of tetraethyl silicate, 37.6 parts by weight of ethanol, and 0.3 parts by weight of hydrochloric acid by stirring for 24 hours was applied by a spin coating, dried at 80° C. for 5 hours, and fired at 1000° C. for 1 hour to form an insulating layer 500 of a 2 μm-thick SiO$_2$ film on the surface of the ceramic substrate 11.

(6) Next, the ceramic substrate was ground with a diamond grind stone of #220 at 1 kg/cm$^2$ load to adjust the surface roughness to Ra=0.6 μm.

(7) After that, some portions of the through holes for conductor-filled through holes were hollowed out to form concave portions and using a gold braze of Ni—Au, terminal pins made of Kovar were connected by conducting heating and reflowing of the braze at 700° C. Incidentally, the connection of the terminal pins is preferable to have a supporting structure of three-point support with tungsten supports. Because such a structure can assure the connection reliability.

(8) Further, a plurality of thermocouples for temperature control were fixed by silica sol and the silica sol was dried at 100° C. for 1 hour to complete production of a ceramic heater.

EXAMPLE 4

A ceramic heater was produced in this example in an approximately same manner as Example 3, except the following different points. That is, after a ceramic substrate bearing an insulating layer was obtained in the step (5), the substrate was ground with a diamond grind stone of #120 at 1 kg/cm² load to adjust the surface roughness to Ra=1.0 μm.

Further, a heat transmission plate 42 made of a 1 mm-thick aluminum plate was installed in the installation points of the thermocouples and further through the heat transmission plate 42, as shown in FIG. 4, sheaths S containing the thermocouple 44 were brought into contact with the surface of the ceramic substrate by springs 45.

EXAMPLE 5

A ceramic heater was produced in this example in an approximately same manner as Example 1, except the following different points. That is, after a ceramic substrate bearing an insulating layer was obtained in the step (3), the substrate was ground with a diamond grind stone of #220 at 1 kg/cm² load and successively polished with a polishing cloth (Malto Co.) and a diamond paste (particle diameter of 0.1 μm) to adjust the surface roughness to Ra=0.0008 μm.

EXAMPLE 6

A ceramic heater was produced in this example in an approximately same manner as Example 1, except the following different points. That is, after a ceramic substrate bearing an insulating layer was obtained in the step (3), the substrate was ground with a diamond grind stone of #100 at 1 kg/cm² load to adjust the surface roughness to Ra=1.5 μm.

EXAMPLE 7

A ceramic heater was produced in this example in an approximately same manner as Example 1, except the following different points. That is, after a ceramic substrate bearing an insulating layer was obtained in the step (3), the substrate was ground with a diamond grind stone of #80 at 1 kg/cm² load to adjust the surface roughness to Ra=2.0 μm.

EXAMPLE 8

A ceramic heater was produced in this example in an approximately same manner as Example 1, except the following different points. That is, after a ceramic substrate bearing an insulating layer was obtained in the step (3), the substrate was subjected to drilling in the face opposed to the face of the substrate for heating an object to be heated such as a semiconductor wafer and the like to form concave portions with a diameter of 10 mm and further ground with a rod-like diamond grind stone of #100 at 1 kg/cm² load to adjust the surface roughness to Ra=1.5 μm.

Further, sheath-type thermocouples obtained by sheathing K-type thermocouples together with magnesia and alumina in sheaths made of a stainless steel were transversely set and fixed on the bottom faces of the concave portions as shown in FIG. 7 while being pressed by the aluminum plate and springs.

EXAMPLE 9

A ceramic heater was produced in this example in an approximately same manner as Example 1, except the following different points. That is, after a ceramic substrate bearing an insulating layer was obtained in the step (3), the substrate was subjected to drilling on the face opposed to the face of the substrate for heating an object to be heated such as a semiconductor wafer and the like to form concave portions with a diameter of 10 mm and further ground with a rod-like diamond grind stone of #50 at 1 kg/cm² load to adjust the surface roughness to Ra=3 μm.

Further, sheath-type thermocouples obtained by sheathing K-type thermocouples together with magnesia and alumina in sheaths made of a stainless steel were transversely set and fixed on the bottom faces of the concave portions as shown in FIG. 7 while being pushed by the aluminum plate and springs.

EXAMPLE 10

A ceramic heater was produced in this example in an approximately same manner as Example 1, except the following different points. That is, after a ceramic substrate bearing an insulating layer was obtained in the step (3), the substrate was subjected to drilling in the face opposed to the face of the substrate for heating an object to be heated such as a semiconductor wafer and the like to form concave portions with a diameter of 10 mm and further ground with a rod-like diamond grind stone of #30 at 1 kg/cm²load to adjust the surface roughness to Ra=5 μm.

Further, sheath-type thermocouples obtained by sheathing K-type thermocouples together with magnesia and alumina in sheaths made of a stainless steel were transversely set and fixed on the bottom faces of the concave portions as shown in FIG. 7 while being pushed by the aluminum plate and springs.

EXAMPLE 11

A ceramic heater was produced in an approximately same manner as Example 1, except that no surface polishing was carried out. The surface roughness Ra of the obtained ceramic heater was 2.2 μm.

Comparative Example 1

A ceramic heater was produced in this example in an approximately same manner as Example 1, except the following different points. That is, after a ceramic substrate bearing an insulating layer was obtained in the step (3), the substrate was subjected to drilling in the face opposed to the face of the substrate for heating an object to be heated such as a semiconductor wafer and the like to form concave portions with a diameter of 10 mm. At the time of drilling, the surface roughness Ra was 5.5 μm.

Further, sheath-type thermocouples obtained by sheathing K-type thermocouples together with magnesia and alumina in sheaths made of a stainless steel were transversely set and fixed on the bottom faces of the concave portions as shown in FIG. 7 while being pushed by the aluminum plate and springs.

<Performance Test>

The difference between the highest temperature and the lowest temperature of the ceramic substrates of Example 1 to 11 and Comparative Example 1 was investigated in the case that temperature thereof was increased to 250° C.

The equipment employed for the performance test was a temperature control apparatus (E5ZE manufactured by Omron) equipped with: a control unit having a power source; a computation unit. The ceramic heaters produced in the respective examples were controlled. Further, after the temperature increase to 250° C., a silicon wafer at 25° C. was placed on each heating face and the time taken until the temperature thereof recovered to 250° C. was measured.

The results were shown in the following Table 1.

TABLE 1

| | Surface roughness of ceramic substrate ($\mu$m) | Temperature difference between the highest temperature and the lowest temperature (° C.) | Time required for recovering to original temperature (second) |
|---|---|---|---|
| Example 1 | 0.01 | 0.5 | 35 |
| Example 2 | 0.008 | 0.3 | 35 |
| Example 3 | 0.6 | 0.5 | 35 |
| Example 4 | 1.0 | 0.5 | 35 |
| Example 5 | 0.0008 | 1.0 | 45 |
| Example 6 | 1.5 | 0.6 | 35 |
| Example 7 | 2.0 | 0.8 | 38 |
| Example 8 | 1.5 (bottom face of concave portion) | 0.3 | 35 |
| Example 9 | 3.0 (bottom face of concave portion) | 0.6 | 35 |
| Example 10 | 5.0 (bottom face of concave portion) | 0.8 | 38 |
| Example 11 | 2.2 | 2.0 | 60 |
| Comparative Example 1 | 5.5 | 6.5 | 80 |

As being made clear from the above results shown in Table 1, if Ra was lower than 0.001 $\mu$m, it is considered that the contact surface area with a thermocouple became too small, and thus the response of the thermocouple deteriorated.

In Example 4, the thermocouples were brought into contact through the aluminum plate and Ra was high, yet the respond was not found deteriorating.

Further, in Examples 8 to 10, the contact surface area was increased by making the thermocouples sheath-type and set transversely, the contact surface area was widened to make more accurate temperature measurement possible, so that the difference between the highest temperature and the lowest temperature was narrowed.

In the case the contact surface area was widened by making the thermocouples sheath-type and set transversely, the temperature control was possible if Ra was up to 5 $\mu$m.

EXAMPLE 12

Manufacture of Ceramic Heater Made of Aluminum Nitride (Reference to FIG. 1)

(1) A composition containing 100 parts by weight of an aluminum nitride powder (the average particle diameter: 1.1 $\mu$m) 4 parts by weight of yttria (the average particle diameter: 0.4 $\mu$m), 12 parts by weight of an acrylic binder, and an alcohol was spray dried to produce a granular powder.

(2) Next, the obtained granular powder was filled in a die and molded to be a flat plate to obtain a raw formed body (a green sheet). The raw formed body was processed by drilling to form through holes 15 to insert lifter pins for a silicon wafer.

(3) On completion of the processing, the raw formed body was hot pressed at 1800° C. and a pressure of 200 kg/cm$^2$ to obtain a 3 mm thick aluminum nitride plate-like body. Next, a disk with a diameter of 12 inch (300 mm) was cut out of the plate-like body (a ceramic substrate) 11. Further, a glass paste (G-5177 produced by Shouei Chemical Products Co., Ltd.) was applied to the surface and heated to 1000° C. to form a 2 $\mu$m thick-SiO$_2$ film.

The ceramic substrate 11 was ground with a diamond grind stone of #220 at 1 kg/cm$^2$ load and polished with a polishing cloth (Malto Co.) and a diamond paste (particle diameter of 0.5 $\mu$m) to adjust the surface roughness to Ra=0.01 $\mu$m. Incidentally, the measurement of the surface roughness was carried out by a probe type surface roughness meter (Surfcom 920A. Tokyo Precision Co.).

(4) On the ceramic substrate 11 obtained as described above (3), a conductor containing paste was printed by screen printing. The printed pattern was made to be a concentric pattern as shown in FIG. 1. As the conductor containing paste, Sorbest PS603D produced by Tokuriki Chemical Research Co., Ltd. used for a plated through hole was used. The conductor containing paste was a silver-lead paste and contained 7.5 parts by weight of metal oxides consisting of lead oxide (5% by weight), zinc oxide (55% by weight), silica (10% by weight), boron oxide (25% by weight), and alumina (5% by weight) in 100 parts by weight of Ag. The silver particle had an average particle diameter 4.5 $\mu$m and a scaly shape.

(5) Next, the ceramic substrate 11 bearing the printed conductor containing paste was heated and fired at 780° C. to sinter silver and lead in the conductor containing paste and simultaneously bake them on the ceramic substrate 11 to form a heating element 12. The silver-lead heating element 12 had a thickness of 5 $\mu$m, a width of 2.4 mm and an area resistivity of 7.7 m$\Omega$/□.

(6) Next, the ceramic substrate 11 produced as described in (5) was immersed in an electroless nickel plating bath of an aqueous solution containing 80 g/L of nickel sulfate, 24 g/L of sodium hypophosphite, 12 g/L of sodium acetate, 8 g/L of boric acid, and 6 g/L of ammonium chloride to deposit a 1 $\mu$m-thick metal covering layer (nickel layer) 24 on the surface of the silver-lead heating element 12.

(7) To the portions where terminals for assuring the connection with an electric power source, a silver-lead solder paste (Tanaka Noble Metals.Co) was applied by screen printing to form a solder layer. Then, terminal pins 13 made of Kovar were attached on the solder layer and the solder was heated for reflow at 420° C. to attach the terminal pins 12 to the surface of the heating element 12.

(8) Thermocouples (sheath-type thermocouple shown in FIG. 4) for temperature control were brought into contact with the bottom face of the ceramic substrate 11 through a heat transmission plate 42 made of a 2 mm-thick aluminum nitride plate in which dents were formed. In this case, as shown in FIG. 6, coil springs 45 were placed so as to insert the sheaths S containing the thermocouples 4 on an intermediate bottom plate 52 and pushed the sheaths with a force of 2 kg to push up the projections formed on the sheaths S by the coil spring 45, so that the sheath-type thermocouples were brought into contact with the bottom face 11b of the ceramic substrate 11 through the heat transmission plate 42 and thus the production of the ceramic heater 10 was completed.

EXAMPLE 13

Manufacture of Ceramic Heater Made of Silicon Carbide

A ceramic heater made of silicon carbide was manufactured in the same manner as Example 12, except that silicon carbide with an average particle diameter of 1.0 μm was used and the sintering temperature was 1900° C. and further, the obtained ceramic substrate surface was fired at 1500° C. for 2 hours to form a 1 μm-thick $SiO_2$ layer on the surface.

The substrate was ground with a diamond grind stone of #220 at 1 kg/cm² load and polished with a polishing cloth (Malto Co.) and a diamond paste (particle diameter of 0.25 μm) to adjust the surface roughness to Ra=0.008 μm.

Next, as shown FIG. 7, using leaf springs 60 made of Kovar, sheaths S housing the thermocouples 44 were pushed against the bottom face 11b of the ceramic substrate 11 by a force of 1 kg through the heat transmission plate 42 made of a 2 mm-thick aluminum plate in which dents were formed.

EXAMPLE 14

Manufacture of Ceramic Heater Containing Heating Element Inside (Reference to FIG. 9)

(1) Using a paste produced by mixing an aluminum nitride powder (the average particle diameter: 1.1 μm produced by Tokuyama), 4 parts by weight of yttria (the average particle diameter: 0.4 μm), 11.5 parts by weight of an acrylic binder, 0.5 parts by weight of a dispersant, and 53 parts by weight of alcohol consisting of 1-butanol and ethanol, forming was carried out by a doctor blade method to obtain a 0.47 mm green sheet.

(2) Successively, after the green sheet was dried at 80° C. for 5 hours, portions to be through holes 15 with diameters of 1.8 mm, 3.0 mm, and 5.0 mm to insert silicon wafer lifter pins into and portions to be conductor-filled through holes for connection with terminal pins were formed by punching.

(3) Next, a conductor containing paste A was produced by mixing 100 parts by weight of a tungsten carbide particle with an average particle diameter of 1 μm, 3.0 parts by weight of an acrylic binder, 3.5 parts by weight of α-terpineol solvent, and 0.3 parts by weight of a dispersant.

Further, a conductor containing paste B was produced by mixing 100 parts by weight of a tungsten carbide particle with an average particle diameter of 1 μm, 1.9 parts by weight of an acrylic binder, 3.7 parts by weight of α-terpineol solvent, and 0.2 parts by weight of a dispersant.

(4) Using the conductor containing paste A, printing on the green sheet was carried out by a screen printing to form a conductor containing paste layer. The printed pattern was made to be a concentric pattern as shown in FIG. 1. Further, the through holes for forming conductor-filled through holes for connection with terminal pins were filled with the conductor containing paste B. On the green sheet finished for the above-mentioned treatment, 37 green sheets and 13 green sheets with no printing with the tungsten paste were laminated on the upper side (heating face) and on the lower side, respectively, and laminated at 130° C. and 80 kg/cm² pressure.

(5) The laminated body obtained in such a manner was degreased at 600° C. for 5 hours in nitrogen gas and hot pressed at 1890° C. and 150 kg/cm² pressure for 3 hours to obtain a 3 mm-thick aluminum nitride plate body. The obtained plate-like body was cut into a disk-like shape with a diameter of 300 mm to obtain a plate-like body made of a ceramic containing a heating element with a thickness of 6 μm and a width of 10 mm inside thereof.

A sol solution produced by hydrolysis polymerization of a mixed solution containing 25 parts by weight of tetraethyl silicate, 37.6 parts by weight of ethanol, and 0.3 parts by weight of hydrochloric acid by stirring for 24 hours was applied by a spin coating, dried at 80° C. for 5 hours, and fired at 1000° C. for 1 hour to form an insulating layer 500 of a 2 μm-thick $SiO_2$ film on the surface of the ceramic substrate 11.

(6) Next, the ceramic substrate was ground with a diamond grindstone of #220 at 1 kg/cm²load to adjust the surface roughness to Ra=0.6 μm.

(7) After that, some portions of the through holes for conductor-filled through holes were hollowed out to form concave portions and using a gold braze of Ni—Au, terminal pins made of Kovar were connected by conducting heating and reflowing of the braze at 700° C. Incidentally, the connection of the terminal pins is preferable to have a supporting structure of three-point support with tungsten supports. Because such a structure can assure the connection reliability.

(8) Further, as shown in FIG. 6, by coil springs 45 arranged on an intermediate bottom plate 52, sheaths S housing the thermocouples 44 were pushed against and brought into contact with the bottom face of the ceramic substrate 11 by 2 kg force through the heat transmission plate 42 made of a 2 mm-thick aluminum plate in which dents were formed and thus the production of the ceramic heater 10 was completed.

EXAMPLE 15

This example was similar to Example 12, however different from Example 12 in a point that, as shown in FIG. 12, the thermocouples 74 were fixed by leaf springs 76 made of a stainless steel and bolts 75. The pressing force was 8 mg ($8 \times 10^{-6}$ kg).

EXAMPLE 16

This example was similar to Example 12, however different from Example 12 in a point that, as shown in FIG. 11, the thermocouples 64 were fixed by presser plates 66 made of a stainless steel and bolts 65. The pressing force was 15 kg.

EXAMPLE 17

This example was similar to Example 12, however different from Example 12 in a point that, as shown in FIG. 11, the thermocouples 64 were fixed by presser plates 66 made of a stainless steel and bolts 65. The pressing force was 25 kg.

EXAMPLE 18

This example was similar to Example 12, however different from Example 12 in a point that, as shown in FIG. 7, the substrate was subjected to drilling on the face opposed to the wafer heating face to form concave portions 95 with a diameter of 10 mm and sheath-type thermocouples obtained by sheathing thermocouples 94 together with MgO and $Al_2O_3$ powder in sheaths 96 made of a stainless steel were pushed through aluminum plates 92 by springs 93 arranged on the intermediate bottom plate 8 land pushed against and fixed on the bottom face formed in the concave portions 95 of the ceramic substrate 91. The pressing force was 1 kg.

Comparative Example 2

A ceramic heater was produced in approximately same manner as Example 12, however that thermocouples were fixed on the surface of the ceramic substrate using an inorganic adhesive (Aron Ceramic produced by Toagosei Chemical Industry Co., Ltd.) was the different point from Example 12.

Comparative Example 3

A ceramic heater was produced in approximately same manner as Example 12, however that sheaths S housing the thermocouples 84 were stood in pipes 85 of the bottom plate 52 to only keep contact with the ceramic substrate 11 was the different point. Although the accurate measurement was difficult, the pressing force was supposed to be 0.8 mg ($0.8 \times 10^{-6}$ kg) or less.

<Performance Test>

The ceramic heaters of Examples 12 to 18 and Comparative Examples 2,3 were heated to 250° C. and occurrence of dropping of the thermocouples after leaving them for 1000 hours was investigated.

Further, ceramic heaters of Examples 12 to 18 and Comparative Examples 2,3 were heated to 200° C. and a silicon wafer was heated at a distance of 150 µm from the heating face and the difference between the highest temperature and the lowest temperature of the silicon wafer was measured by a thermo-viewer.

The results were shown in the following Table 2.

TABLE 2

| | Pressing force (kg) | Presence or absence of dropping | Temperature difference* (° C.) |
|---|---|---|---|
| Example 12 | 2 | Absence | 0.2 |
| Example 13 | 1 | Absence | 0.5 |
| Example 14 | 2 | Absence | 0.3 |
| Example 15 | $8 \times 10^{-6}$ | Absence | 0.8 |
| Example 16 | 15 | Absence | 0.8 |
| Example 17 | 25 | Absence | 5.0 |
| Example 18 | 1 | Absence | 0.1 |
| Comparative Example 2 | — | Presence | 0.5 |
| Comparative Example 3 | $<0.8 \times 10^{-6}$ | Absence | 5.0 |

Note)
*Temperature difference: temperature difference between the highest temperature and the lowest temperature.

As a result, in the ceramic heaters of Examples 12 to 18, no dropping of the thermocouples took place, whereas the ceramic heater of Comparative Example 2, the thermocouple dropped. Further, as the case of Examples 12 to 18 and Comparative Example 3, in the case the temperature measurement elements were pressed on and fixed, being different from that in the case of only being pressed on, they did not drop. However, in the case the thermocouple was firmly pressed on (Example 17) or kept so as to have only a contact (Comparative Example 3), temperature correction was supposed to be necessary. In the case that the thermocouples were pushed by a force of $1 \times 10^{-6}$ to 20 kg, such correction was supposed to be unnecessary.

INDUSTRIAL APPLICABILITY

As described above, according to the ceramic heater for a semiconductor producing/examining device of the first aspect of the present invention, accurate temperature measurement is made possible and the whole body of a silicon wafer is made possible to be heated evenly by adjusting the heating state of the heating element based on the temperature measurement result.

Also, by the ceramic heater for a semiconductor producing/examining device of the second aspect of the present invention, the temperature measurement element does not drop and safety for a long duration can be retained and also, it is made possible to accurately measure temperature thereof, so that the whole body of a silicon wafer is made possible to be heated evenly by adjusting the heating state of the heating element based on the temperature measurement result.

What is claimed is:

1. A ceramic heater for a semiconductor producing/examining device, comprising:
    a ceramic substrate having a first surface configured to heat a semiconductor wafer and a second surface formed on an opposite side of the first surface;
    at least one heating device positioned on the second surface of said ceramic substrate or inside of said ceramic substrate configured to generate sufficient heat for producing/examining a semiconductor; and
    at least one thermocouple device provided in contact with the second surface of said ceramic substrate so as to measure a temperature of the ceramic substrate,
    wherein the second surface has a surface roughness of Ra≦5 µm at least in a portion where said second surface of said ceramic substrate is in contact with said at least one thermocouple device.

2. The ceramic heater for a semiconductor producing/examining device according to claim 1, wherein the surface roughness of said second surface is Ra≦2 µm.

3. The ceramic heater for a semiconductor producing/examining device according to claim 1, wherein said ceramic substrate comprises an insulating layer and a ceramic substrate body, the insulating layer includes the second surface and has a volume resistivity higher than that of the ceramic substrate body.

4. The ceramic heater for a semiconductor producing/examining device according to claim 3, wherein said ceramic substrate body comprises one of a nitride ceramic material and a carbide ceramic material and said insulating layer comprises an oxide ceramic material.

5. The ceramic heater for a semiconductor producing/examining device according to claim 4, wherein said oxide ceramic material comprises at least one oxide selected from the group consisting of silica, alumina, mullite, cordierite and beryllia.

6. The ceramic heater for a semiconductor producing/examining device according to claim 4, wherein said ceramic substrate body comprises a aluminum nitride.

7. The ceramic heater for a semiconductor producing/examining device according to claim 1, wherein said at least one thermocouple device comprises a heat transmission plate having a thermal conductivity higher than that of said ceramic substrate and said heat transmission plate is positioned in contact with the second surface of said ceramic substrate.

8. The ceramic heater for a semiconductor producing/examining device according to claim 1, wherein said at least one thermocouple device comprises a thermocouple and a sheath housing the thermocouple.

9. The ceramic heater for a semiconductor producing/examining device according to claim 8, further comprising at least one pressing device configured to press said at least one thermocouple device on the second surface of the ceramic substrate with force of $1 \times 10^{-6}$ to 20 Kg.

10. The ceramic heater for a semiconductor producing/examining device according to claim 8, wherein said at least one thermocouple device further comprises a heat transmission plate provided in contact with the second surface of the ceramic substrate and having a concave portion fitted with the sheath.

11. The ceramic heater for a semiconductor producing/examining device according to claim 1, wherein said at least one thermocouple device comprises a thermocouple and a protecting material fixing and sealing said thermocouple to said ceramic substrate.

12. The ceramic heater for a semiconductor producing/examining device according to claim 11, wherein said protecting material comprises one of a heat resistant resin material and a ceramic material, the heat resistant resin material comprises at least one thermosetting resin selected from the group consisting of epoxy resin, polyimide resin and bismaleimide-triazine resin, and the ceramic material comprises at least one ceramic sol selected from group consisting of alumina sol and silica sol.

13. The ceramic heater for a semiconductor producing/examining device according to claim 1, further comprising at least one pressing device configured to press said at least one thermocouple device against said second surface of said ceramic substrate.

14. The ceramic heater for a semiconductor producing/examining device according to claim 13, wherein said at least one pressing device is configured to press the at least one thermocouple device with force of $1 \times 10^{-6}$ to 20 Kg.

15. The ceramic heater for a semiconductor producing/examining device according to claim 13, wherein said at least one pressing device comprises at least one of a spring, a leaf spring, and a presser plate.

16. A ceramic heater for a semiconductor producing/examining device according to claim 1, wherein said second surface includes at least one concave portion and said at least one thermocouple device is provided in the at least one concave portion.

17. The ceramic heater for a semiconductor producing/examining device according to claim 1, wherein said at least one thermocouple device comprises a thermocouple and a sheath housing said thermocouple and at least one electrically insulating power material selected from the group consisting of alumina, silica and magnesia.

18. The ceramic heater for a semiconductor producing/examining device according to claim 1, wherein said ceramic substrate comprises one of a nitride ceramic material and a carbide ceramic material.

19. The ceramic heater for a semiconductor producing/examining device according to claim 18, wherein said nitride ceramic material comprises at least one nitride selected from the group consisting of aluminum nitride, silicon nitride, boron nitride and titanium nitride, and said carbide ceramic material comprises at least one carbide selected from the group consisting of silicon carbide, zirconium carbide, titanium carbide, tantalum carbide and tungsten carbide.

20. The ceramic heater for a semiconductor producing/examining device according to claim 1, further comprising pressing means for pressing said at least one thermocouple device against said second surface of said ceramic substrate.

* * * * *

UNITED STATES PATENT AND TRADEMARK OFFICE
CERTIFICATE OF CORRECTION

PATENT NO.    : 6,878,906 B2
DATED         : April 12, 2005
INVENTOR(S)   : Ito et al.

It is certified that error appears in the above-identified patent and that said Letters Patent is hereby corrected as shown below:

<u>Title page,</u>
Item [30], should read:
-- [30] Foreign Application Priority Data
Aug. 30. 2000 (JP) …………………....2000-261474
Aug. 30. 2000 (JP)……………………2000-261475 --

Signed and Sealed this

Fourteenth Day of June, 2005

JON W. DUDAS
*Director of the United States Patent and Trademark Office*

UNITED STATES PATENT AND TRADEMARK OFFICE
CERTIFICATE OF CORRECTION

PATENT NO.    : 6,878,906 B2
DATED         : April 12, 2005
INVENTOR(S)   : Yasutaka Ito et al.

It is certified that error appears in the above-identified patent and that said Letters Patent is hereby corrected as shown below:

Column 34,
Line 16, insert -- and -- between "substrate" and "configured."

Signed and Sealed this

Ninth Day of August, 2005

JON W. DUDAS
*Director of the United States Patent and Trademark Office*